(12) United States Patent
Park et al.

(10) Patent No.: US 12,135,845 B2
(45) Date of Patent: Nov. 5, 2024

(54) INSPECTABLE ELECTRONIC DEVICE AND METHOD OF INSPECTING THE SAME

(71) Applicant: SAMSUNG DISPLAY CO., LTD., Yongin-si (KR)

(72) Inventors: Jaehyun Park, Seoul (KR); Min-Hong Kim, Hwaseong-si (KR); Jungmok Park, Gyeonggi-do (KR); Jiyeong Lee, Seoul (KR); Hyun-Wook Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 171 days.

(21) Appl. No.: 17/399,304

(22) Filed: Aug. 11, 2021

(65) Prior Publication Data

US 2022/0121309 A1   Apr. 21, 2022

(30) Foreign Application Priority Data

Oct. 16, 2020   (KR) .................. 10-2020-0133968

(51) Int. Cl.
| | |
|---|---|
| *G06F 3/041* | (2006.01) |
| *G01R 31/28* | (2006.01) |
| *H10K 50/842* | (2023.01) |
| *H10K 59/40* | (2023.01) |
| *G06F 3/044* | (2006.01) |

(52) U.S. Cl.
CPC ....... *G06F 3/0416* (2013.01); *G01R 31/2829* (2013.01); *G06F 3/0412* (2013.01); *H10K 50/8426* (2023.02); *H10K 59/40* (2023.02); *G06F 3/0446* (2019.05)

(58) Field of Classification Search
CPC .... G06F 3/0416; G06F 3/0412; G06F 3/0446; G06F 3/04164; G01R 31/2829; G01R 31/2812; G01R 31/00; G01R 27/02; G01R 31/2825; G01R 31/2843; G01R 31/52; H10K 50/8426; H10K 59/40; G09G 3/006;

(Continued)

(56) References Cited

U.S. PATENT DOCUMENTS

| | | |
|---|---|---|
| 4,914,602 A | 4/1990 | Abe et al. |
| 6,310,667 B1 | 10/2001 | Nakayoshi et al. |

(Continued)

FOREIGN PATENT DOCUMENTS

| | | |
|---|---|---|
| JP | 1856904 | 7/1994 |
| JP | 2010-086498 A2 | 4/2010 |

(Continued)

*Primary Examiner* — David D Davis
(74) *Attorney, Agent, or Firm* — F. CHAU & ASSOCIATES, LLC

(57) ABSTRACT

An electronic device includes a display panel, an input sensor disposed on the display panel and including a sensing electrode, a first signal line connected to the sensing electrode, and a second signal line connected to the sensing electrode, and a circuit board electrically connected to the input sensor. The circuit board includes a first group signal line electrically connected to the first signal line, a second group signal line electrically connected to the first group signal line and to the second signal line, a first inspection signal line electrically connected to the first group signal line, and a second inspection signal line electrically connected to the second group signal line.

19 Claims, 15 Drawing Sheets

(58) Field of Classification Search
CPC ..... H01L 23/481; H01L 23/485; H01L 23/50; H01L 23/525
See application file for complete search history.

(56) References Cited

U.S. PATENT DOCUMENTS

| | | |
|---|---|---|
| 8,493,345 B2 | 7/2013 | Anno |
| 9,547,207 B2 | 1/2017 | Moh et al. |
| 10,706,753 B2* | 7/2020 | Lee .................. G02F 1/136213 |
| 10,768,730 B2 | 9/2020 | Kim |
| 11,644,724 B2* | 5/2023 | Fujikawa ............ G02F 1/13338 345/174 |
| 2006/0103412 A1* | 5/2006 | Kimura ................. G09G 3/006 73/865.8 |
| 2014/0160072 A1* | 6/2014 | Inagaki ................ G06F 3/0443 345/174 |
| 2019/0051708 A1* | 2/2019 | Jeong ................ H10K 59/1213 |
| 2021/0326000 A1* | 10/2021 | Yang .................. G06F 3/04164 |

FOREIGN PATENT DOCUMENTS

| | | |
|---|---|---|
| KR | 10-1999-0072860 A | 9/1999 |
| KR | 10-2007-0027891 | 3/2007 |
| KR | 10-2015-0092433 | 8/2015 |
| KR | 10-2019-0075653 | 7/2019 |
| KR | 10-2019-0085580 | 7/2019 |
| KR | 10-2020-0016308 | 2/2020 |

\* cited by examiner

INSPECTABLE ELECTRONIC DEVICE AND METHOD OF INSPECTING THE SAME

CROSS-REFERENCE TO RELATED APPLICATIONS

This U.S. non-provisional patent application claims priority under 35 U.S.C. § 119 to Korean Patent Application No. 10-2020-0133968, filed on Oct. 16, 2020, the contents of which are hereby incorporated by reference in its entirety.

TECHNICAL FIELD

The present disclosure relates to an electronic device and a method of inspecting the same. More particularly, the present disclosure relates to an electronic device including an input sensor and a circuit board and a method of inspecting the electronic device.

DISCUSSION OF RELATED ART

Various display devices that are applied to multimedia devices, such as televisions, mobile phones, tablet computers, navigation devices, and game devices, are being developed. The display devices include a keyboard or a mouse as their input device. In addition, the display devices include an input sensor, such as a touch panel, as their input device.

Various defects occur in the process of manufacturing the display device. The defects also occur in a bonding area of the input sensor and a circuit board.

SUMMARY

The present disclosure provides an electronic device capable of checking defects in a bonding area.

The present disclosure provides a method of inspecting the bonding area of the electronic device for defects.

According to an embodiment of the inventive concept, an electronic device includes an input sensor and a circuit board electrically connected to the input sensor. The input sensor includes a first sensing electrode. The input sensor further includes a second sensing electrode crossing the first sensing electrode. The input sensor further includes a first signal line connected to an end of the first sensing electrode. The input sensor further includes a second signal line connected to one end of the second sensing electrode. The input sensor further includes a third signal line connected to another end of the second sensing electrode. The circuit board includes an insulating layer. The circuit board further includes a first group signal line disposed on the insulating layer and electrically connected to the first signal line. The circuit board further includes a second group signal line disposed on the insulating layer and electrically connected to the second signal line. The circuit board further includes a third group signal line electrically connected to the third signal line and to the second group signal line. The circuit board further includes a first inspection signal line electrically connected to the second group signal line. The first inspection signal line includes a first inspection terminal disposed outside an area in which the first group signal line, the second group signal line, and the third group signal line are disposed. The circuit board further includes a second inspection signal line electrically connected to the third group signal line. The second inspection signal line includes a second inspection terminal disposed outside the area in which the first group signal line, the second group signal line, and the third group signal line are disposed.

In an embodiment, the third group signal line includes a first portion disposed on a same layer as the second group signal line and a second portion disposed on a different layer than the second group signal line.

In an embodiment, the first portion is disposed on one surface of the insulating layer, the second portion is disposed on an other surface of the insulating layer, and the first portion is connected to the second portion via a through hole defined through the insulating layer.

In an embodiment, at least one of the first inspection signal line and the second inspection signal line includes a third portion disposed on a same layer as the second group signal line and a fourth portion disposed on a different layer than the second group signal line.

In an embodiment, the third portion is disposed on a surface of the insulating layer, the fourth portion is disposed on an other surface of the insulating layer, and the third portion is connected to the fourth portion via a through hole defined through the insulating layer.

In an embodiment, the circuit board further includes a protective layer disposed on the insulating layer. The protective layer covers the first inspection terminal and the second inspection terminal, and the protective layer exposes one end of each of the first group signal line, the second group signal line, and the third group signal line.

In an embodiment, the second inspection signal line is disposed on a same layer as the second group signal line.

In an embodiment, the electronic device further includes a driving circuit chip mounted on the circuit board. The first group signal line and the second group signal line are electrically connected to the driving circuit chip.

In an embodiment, the input sensor and the circuit board are electrically connected to each other by an anisotropic conductive adhesive layer.

In an embodiment, the input sensor further includes a fourth signal line connected to the first sensing electrode. The circuit board further includes a fourth group signal line electrically connected to the first group signal line and to the fourth signal line. The circuit board further includes a third inspection signal line electrically connected to the first group signal line. The third inspection signal line includes a third inspection terminal disposed outside an area in which the first group signal line, the second group signal line, the third group signal line, and the fourth group signal line are disposed. The circuit board further includes a fourth inspection signal line electrically connected to the fourth group signal line. The fourth inspection signal line includes a fourth inspection terminal disposed outside the area in which the first group signal line, the second group signal line, the third group signal line, and the fourth group signal line are disposed.

According to an embodiment of the inventive concept, a method of inspecting an electronic device is provided. The electronic device includes an input sensor and a circuit board electrically connected to the input sensor. The input sensor includes a first sensing electrode. The input sensor further includes a second sensing electrode crossing the first sensing electrode. The input sensor further includes a first signal line connected to the first sensing electrode. The input sensor further includes a second signal line connected to the second sensing electrode. The input sensor further includes a third signal line connected to the second sensing electrode. The circuit board includes a first group signal line electrically connected to the first signal line. The circuit board further includes a second group signal line electrically connected to the second signal line. The circuit board further includes a third group signal line electrically connected to the second group signal line and to the third signal line. The circuit board further includes a first inspection signal line electrically connected to the second group signal line. The first inspection signal line includes a first inspection terminal disposed outside an area in which the first group signal line, the second group signal line, and the third group signal line are disposed. The circuit board further includes a second inspection signal line electrically connected to the third group signal line. The second inspection signal line includes a second inspection terminal disposed outside the area in which the first group signal line, the second group signal line, and the third group signal line are disposed. The method includes electrically opening the second group signal line and the third group signal line and measuring a resistance between the first inspection terminal and the second inspection terminal.

In an embodiment, the electrically opening the second group signal line and the third group signal line includes cutting the circuit board.

In an embodiment, the measuring the resistance between the first inspection terminal and the second inspection terminal includes measuring a voltage drop between the first inspection terminal and the second inspection terminal.

In an embodiment, the method further includes inspecting the second signal line and the third signal line for a disconnection between the second signal line and the third signal line.

In an embodiment, the circuit board further includes a protective layer that covers the first inspection terminal and the second inspection terminal and exposes one end of each of the first group signal line, the second group signal line, and the third group signal line, and the method further includes removing the protective layer such that each of the first inspection terminal and the second inspection terminal is externally exposed.

According to an embodiment of the inventive concept, an electronic device includes a display panel, an input sensor disposed on the display panel and including a sensing electrode, a first signal line connected to the sensing electrode, and a second signal line connected to the sensing electrode, and a circuit board electrically connected to the input sensor. The circuit board includes a first group signal line electrically connected to the first signal line, a second group signal line electrically connected to the first group signal line and to the second signal line, a first inspection signal line electrically connected to the first group signal line, and a second inspection signal line electrically connected to the second group signal line.

In an embodiment, the display panel includes a display substrate including a plurality of pixels, an encapsulation substrate disposed on the display substrate, and a sealing member disposed between the display substrate and the encapsulation substrate. The sealing member attaches the display substrate and the encapsulation substrate.

In an embodiment, the input sensor contacts the encapsulation substrate and an adhesive layer is not disposed between the input sensor and the encapsulation substrate.

In an embodiment, the first inspection signal line includes a first portion disposed on a same layer as the first group signal line and a second portion disposed on a different layer than the first group signal line.

In an embodiment, the second portion of the first inspection signal line is disposed on a same layer as the second group signal line.

According to the above, the bonding area of the input sensor and the circuit board may be inspected for defects. The contact of a conductive bonding structure with respect to a pad of the input sensor and a pad of the circuit board may be inspected for defects.

BRIEF DESCRIPTION OF THE DRAWINGS

The above and other advantages of the present disclosure will become more apparent by reference to the following detailed description when considered in conjunction with the accompanying drawings, in which.

DETAILED DESCRIPTION

Figure 1A:
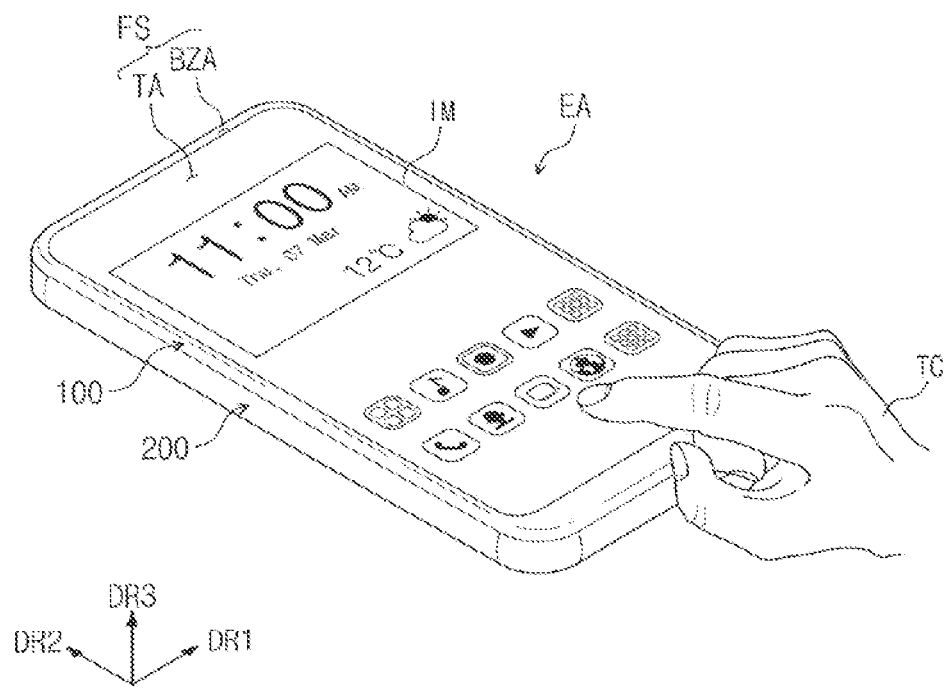
FIG. 1A is a perspective view showing an electronic device according to an embodiment of the present disclosure.

In the present disclosure, it will be understood that when an element or layer is referred to as being "on", "connected to", or "coupled to" another element or layer, it can be directly on, connected to, or coupled to the other element or layer and/or intervening elements or layers that may be present.

Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer, or section. Thus, a first element, component, region, layer, or section discussed below could be termed a second element, component, region, layer, or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as shown in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described with reference to accompanying drawings.

Figure 1B:
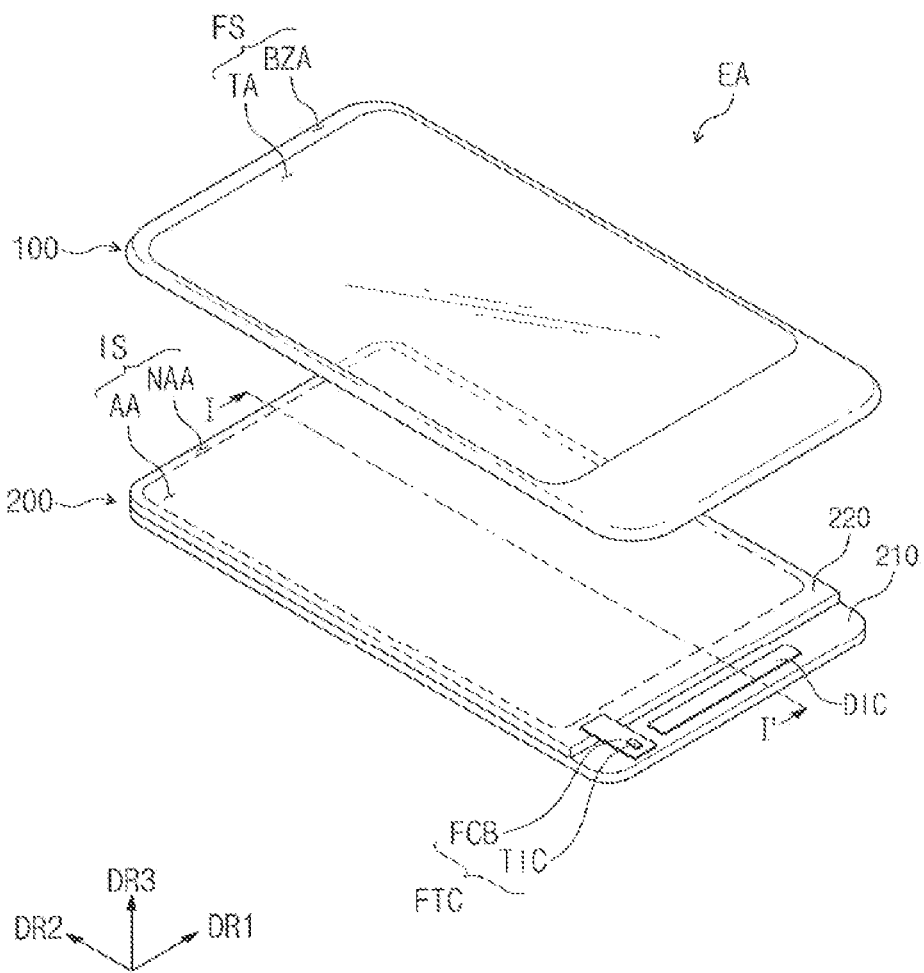
FIG. 1B is an exploded perspective view showing an electronic device according to an embodiment of the present disclosure.
Figure 1C:
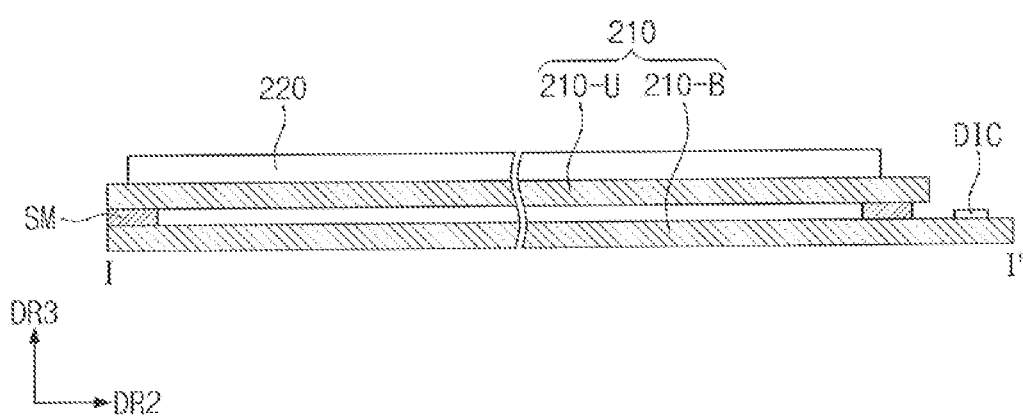
FIG. 1C is a cross-sectional view taken along a line I-I' of FIG. 1B.

FIG. 1A is a perspective view showing an electronic device EA according to an embodiment of the present disclosure. FIG. 1B is an exploded perspective view showing the electronic device EA according to an embodiment of the present disclosure. FIG. 1C is a cross-sectional view taken along a line I-I' of FIG. 1B. Hereinafter, the electronic device EA according to the embodiment will be described with reference to FIGS. 1A and 1B.

Hereinafter, the electronic device EA will be described as a display device and assigned with the same reference numeral, however, the electronic device EA should not be limited to the display device. A device including two or more electronic components electrically connected to each other by a conductive bonding structure may be the electronic device described in the present disclosure.

The display device EA may be a device that provides an image. The display device EA may include various embodiments. For example, the display device EA may include a tablet computer, a notebook computer, a computer, a smart television, or the like. In the present embodiment, a smartphone will be described as a representative example of the display device EA.

The display device EA displays an image IM through a display surface FS. The display surface FS is substantially parallel to a surface defined by a first direction DR1 and a second direction DR2. A third direction DR3 indicates a normal line direction of the display surface FS, i.e., a thickness direction of the display device EA. Front (or upper) and rear (or lower) surfaces of each member or each unit described below are distinguished from each other by the third direction DR3. Hereinafter, the first, second, and third directions DR1, DR2, and DR3 respectively correspond to directions indicated by first, second, and third directional axes and are assigned with the same reference numerals as the first, second, and third directional axes.

The display surface FS through which the image IM is displayed may correspond to a front surface of the display device EA and a front surface FS of a window member 100. Hereinafter, the display surface and the front surface of the display device EA and the front surface of the window member 100 are assigned with the same reference numeral. FIG. 1A shows a clock widget and a plurality of application icons as a representative example of the image IM.

The display device EA includes the window member 100 and an electronic panel 200. Although not shown separately, the display device EA may further include an optical member disposed between the window member 100 and the electronic panel 200. According to an embodiment, the optical member of the present disclosure may include a polarizer. According to an embodiment, the optical member of the present disclosure may further include a retarder. According to an embodiment, the optical member may include a color filter member to reduce a reflectance of an external light.

The window member 100 includes a base panel. For example, the base panel may include glass, plastic, or a combination thereof. The front surface FS of the window member 100 includes a transmission area TA and a bezel area BZA. The transmission area TA may be optically transparent. For example, the transmission area TA may have a transmittance of about 90% or more with respect to a visible light.

The bezel area BZA may have a light transmittance relatively lower than that of the transmission area TA. The bezel area BZA defines a shape of the transmission area TA. The bezel area BZA is defined adjacent to the transmission area TA and surrounds the transmission area TA. The window member 100 may further include a light blocking pattern disposed on the base panel to define the bezel area BZA.

The bezel area BZA has a predetermined color. The bezel area BZA covers a peripheral area NAA of the electronic panel 200 to prevent the peripheral area NAA from being viewed from outside of the display device EA. However, this is merely exemplary, and the bezel area BZA may be omitted from the window member 100 according to an embodiment of the present disclosure.

The electronic panel 200 displays the image IM and senses an external input TC. The image IM is displayed through a front surface IS of the electronic panel 200. The front surface IS of the electronic panel 200 includes an active area AA and the peripheral area NAA. The active area AA is activated in response to an electrical signal.

In the present embodiment, the active area AA is an area through which the image IM is displayed and the external input TC is sensed. The active area AA corresponds to the transmission area TA, and the peripheral area NAA corresponds to the bezel area BZA. In the present disclosure, the expression "an area/portion corresponds to another area/portion" means that "an area/portion overlaps another area/portion", but the expression should not be limited to "an area/portion has the same area and/or the same shape as another area/portion".

The electronic panel 200 includes a display panel 210, an input sensor 220, a driving circuit (hereinafter, referred to as a first driving circuit) DIC, and a circuit module FTC.

The display panel 210 generates the image IM. The display panel 210 may be an organic light emitting display panel or an inorganic light emitting display panel such as a quantum dot light emitting display panel. The panels are distinct from each other depending on a material of a light emitting element. A light emitting layer of the organic light emitting display panel may include an organic light emitting material. A light emitting layer of the quantum dot light emitting display panel may include a quantum dot and/or a quantum rod. Hereinafter, the organic light emitting display panel will be described as a representative example of the display panel 210.

The input sensor 220 senses the external input TC (e.g., a touch event) applied thereto. In the present embodiment, the input sensor 220 is a capacitive type touch sensor; however, the present disclosure should not be limited thereto or thereby.

The first driving circuit DIC is disposed on the display panel 210. The first driving circuit DIC may be mounted on the display panel 210. The first driving circuit DIC is electrically connected to the display panel 210 and applies electrical signals to the display panel 210 to drive the display panel 210.

The circuit module FTC is electrically connected to the input sensor 220. In an embodiment, the circuit module FTC includes a circuit board FCB and a driving circuit chip TIC. The circuit board FCB may be a flexible circuit board. The driving circuit chip TIC may be mounted on the circuit board FCB in a chip-on-film method. In the present embodiment, the circuit module FTC connects the input sensor 220 to the display panel 210.

According to an embodiment, the driving circuit chip TIC may be omitted, and the circuit module FTC may include only the circuit board FCB. According to an embodiment, the driving circuit chip TIC may be mounted on other electronic components. According to an embodiment, in a case where the driving circuit chip TIC is omitted, a driving circuit of the omitted driving circuit chip TIC may be provided integrally with the first driving circuit DIC.

According to an embodiment, the circuit board FCB may be connected to another circuit board (hereinafter, referred to as a main circuit board) without being connected to the display panel 210. The driving circuit chip TIC may be mounted on the main circuit board (not shown). The display panel 210 may be connected to the main circuit board via a circuit board (not shown).

Referring to FIG. 1C, the display panel 210 includes a display substrate 210-B, an encapsulation substrate 210-U, and a sealing member SM attaching the display substrate 210-B to the encapsulation substrate 210-U. The display substrate 210-B includes the pixels that generate images. The encapsulation substrate 210-U encapsulates the pixels to prevent the pixels from being damaged by external moisture or the like.

The first driving circuit DIC may be coupled to the display substrate 210-B. The first driving circuit DIC may be provided in the form of an integrated chip; however, the present disclosure should not be limited thereto or thereby. In an embodiment of the present disclosure, the first driving circuit DIC is not mounted on the display substrate 210-B.

The display substrate 210-B and the encapsulation substrate 210-U may include a glass substrate as their base substrate. The display substrate 210-B may have an area greater than that of the encapsulation substrate 210-U. The first driving circuit DIC may be disposed in an area of the display substrate 210-B exposed without being covered by the encapsulation substrate 210-U; however, the present disclosure should not be limited thereto or thereby. For example, the display substrate 210-B and the encapsulation substrate 210-U may have substantially the same shape as each other.

The sealing member SM may include a frit. The frit may be a ceramic adhesive material and may have a property of being cured after being exposed to a laser beam. The frit may contain from about 15 to about 40 wt % of $V_2O_5$, from about 10 to about 30 wt % of $TeO_2$, from about 1 to about 15 wt % of $P_2O_5$, from about 1 to about 20 wt % of ZnO, from about 5 to about 30 wt % of $ZrO_2$, from about 5 to about 20 wt % of $WO_3$, and from about 1 to about 15 wt % of BaO as a main component and may contain at least one of $Fe_2O_3$, CuO, MnO, $Al_2O_3$, $Na_2O$, and $Nb_2O_5$ as an additive. The frit of such a composition may have a coefficient of thermal expansion of about $40\times10^{-7}/°$ C. to about $100\times10^{-7}/°$ C. and a glass transition temperature of from about 250° C. to 400° C. The sealing member SM may overlap the peripheral area NAA.

Figure 2A:
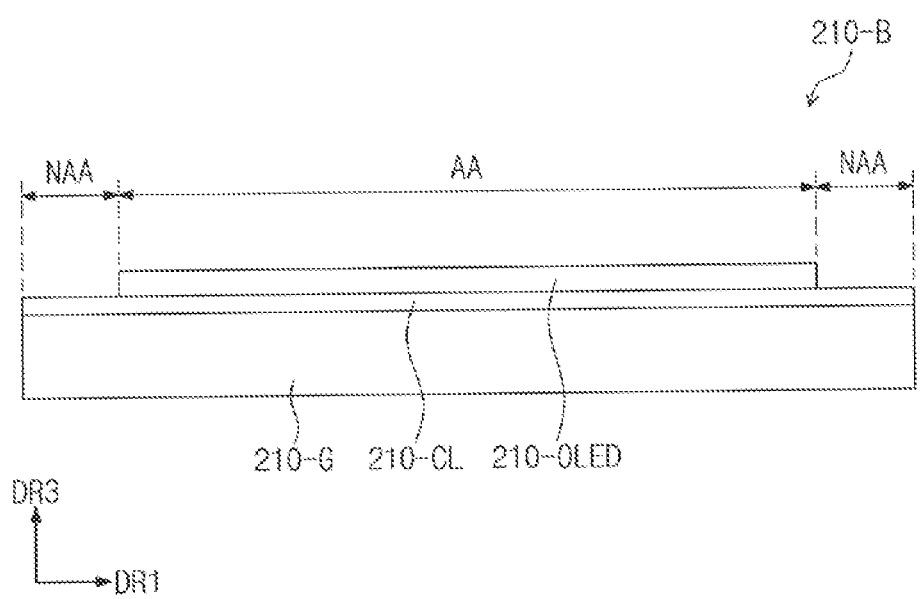
FIG. 2A is a cross-sectional view showing a display substrate shown in FIGS. 1B and 1C.
Figure 2B:
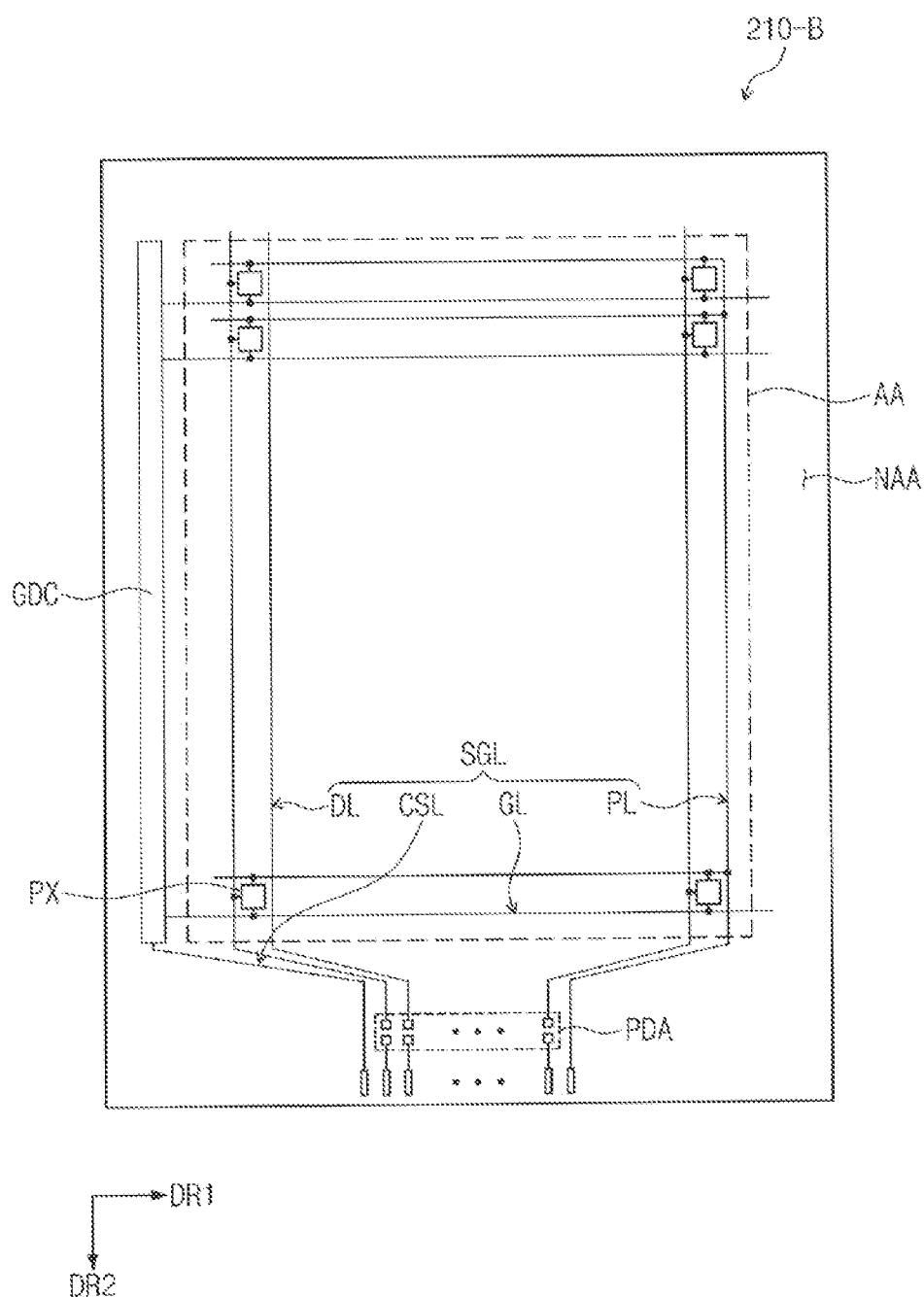
FIG. 2B is a plan view showing a display substrate according to an embodiment of the present disclosure.
Figure 2C:
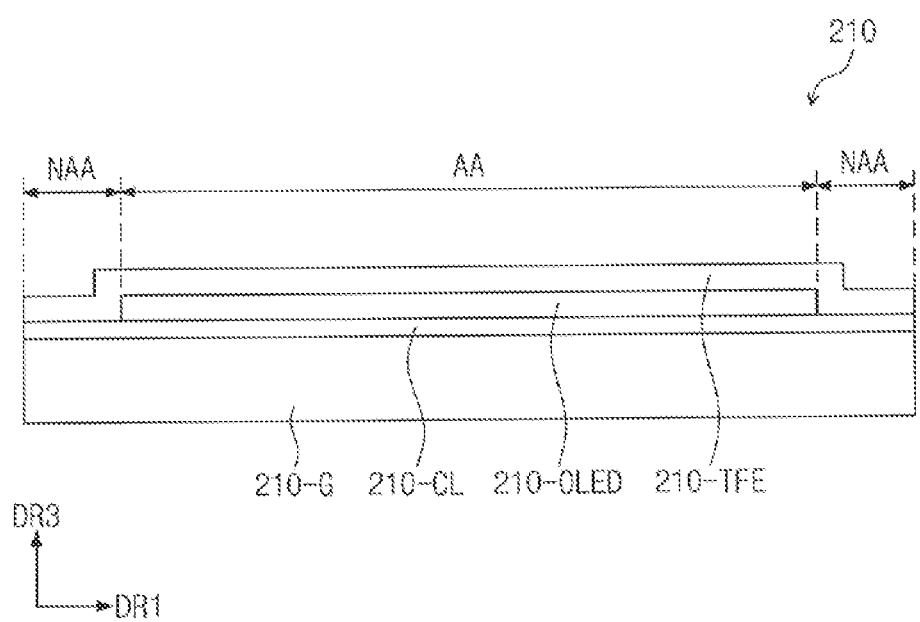
FIG. 2C is a cross-sectional view showing a display panel according to an embodiment of the present disclosure.

FIG. 2A is a cross-sectional view showing the display substrate 210-B shown in FIGS. 1B and 1C. FIG. 2B is a plan view showing the display substrate 210-B according to an embodiment of the present disclosure. FIG. 2C is a cross-sectional view showing the display panel 210 according to an embodiment of the present disclosure.

Referring to FIG. 2A, the display substrate 210-B includes a base substrate 210-G (hereinafter, referred to as a "first base substrate"), a circuit element layer 210-CL disposed on the first base substrate 210-G, and a display element layer 210-OLED. The display substrate 210-B may further include an insulating layer that covers the display element layer 210-OLED.

The first base substrate 210-G includes a glass substrate, a metal substrate, or an organic-inorganic composite substrate. The circuit element layer 210-CL includes at least one insulating layer and a circuit element. The insulating layer includes at least one inorganic layer and at least one organic layer. The circuit element includes signal lines and a pixel driving circuit. The display element layer 210-OLED includes at least organic light emitting diodes as light emitting elements thereof. The display element layer 210-OLED may further include an organic layer such as a pixel definition layer.

Referring to FIG. 2B, the display substrate 210-B includes a driving circuit GDC (hereinafter, referred to as a second driving circuit), a plurality of signal lines SGL, and a plurality of pixels PX.

The second driving circuit GDC includes a scan driving circuit. The scan driving circuit generates a plurality of scan signals and sequentially outputs the scan signals to a plurality of scan lines GL described later. The scan driving circuit may further output another control signal to a driving circuit of the pixels PX.

The scan driving circuit may include a plurality of thin film transistors formed through the same processes, e.g., a low temperature polycrystalline silicon (LTPS) process or a low temperature polycrystalline oxide (LTPO) process, as the driving circuit of the pixels PX.

The signal lines SGL include the scan lines GL, data lines DL, a power line PL, and a control signal line CSL. Each of the scan lines GL is connected to a corresponding pixel among the pixels PX, and each of the data lines DL is connected to a corresponding pixel among the pixels PX. The power line PL is connected to the pixels PX. The control signal line CSL provides control signals to the scan driving circuit.

FIG. 2B shows a mounting area PDA in the display substrate 210-B on which the first driving circuit DIC (refer to FIG. 1C) having a chip form is disposed. The first driving circuit DIC is connected to the data lines DL.

Referring to FIG. 2C, the display panel 210 according to the present embodiment may include a thin film encapsulation layer 210-TFE instead of the encapsulation substrate 210-U shown in FIG. 1C. The thin film encapsulation layer 210-TFE may include at least one inorganic layer. The thin film encapsulation layer 210-TFE may have a stack structure of an inorganic layer/organic layer/inorganic layer. The thin film encapsulation layer 210-TFE may protect the display element layer 210-OLED from a foreign substance, such as moisture, oxygen, dust particles, or the like.

Although not shown in figures, the input sensor 220 shown in FIG. 1C may be disposed on the thin film encapsulation layer 210-TFE. The input sensor 220 may be formed on the thin film encapsulation layer 210-TFE through successive processes. In an embodiment of the present disclosure, an adhesive layer is not disposed between the input sensor 220 and the thin film encapsulation layer 210-TFE.

The thin film encapsulation layer 210-TFE may be formed by a deposition process. Since the encapsulation substrate 210-U is omitted, the sealing member SM shown in FIG. 1C may also be omitted. The display panel 210 according to an embodiment of the present disclosure may further include an additional insulating layer disposed between the display element layer 210-OLED and the thin film encapsulation layer 210-TFE. For instance, the display panel 210 may further include an optical insulating layer to control a refractive index.

Figure 3:
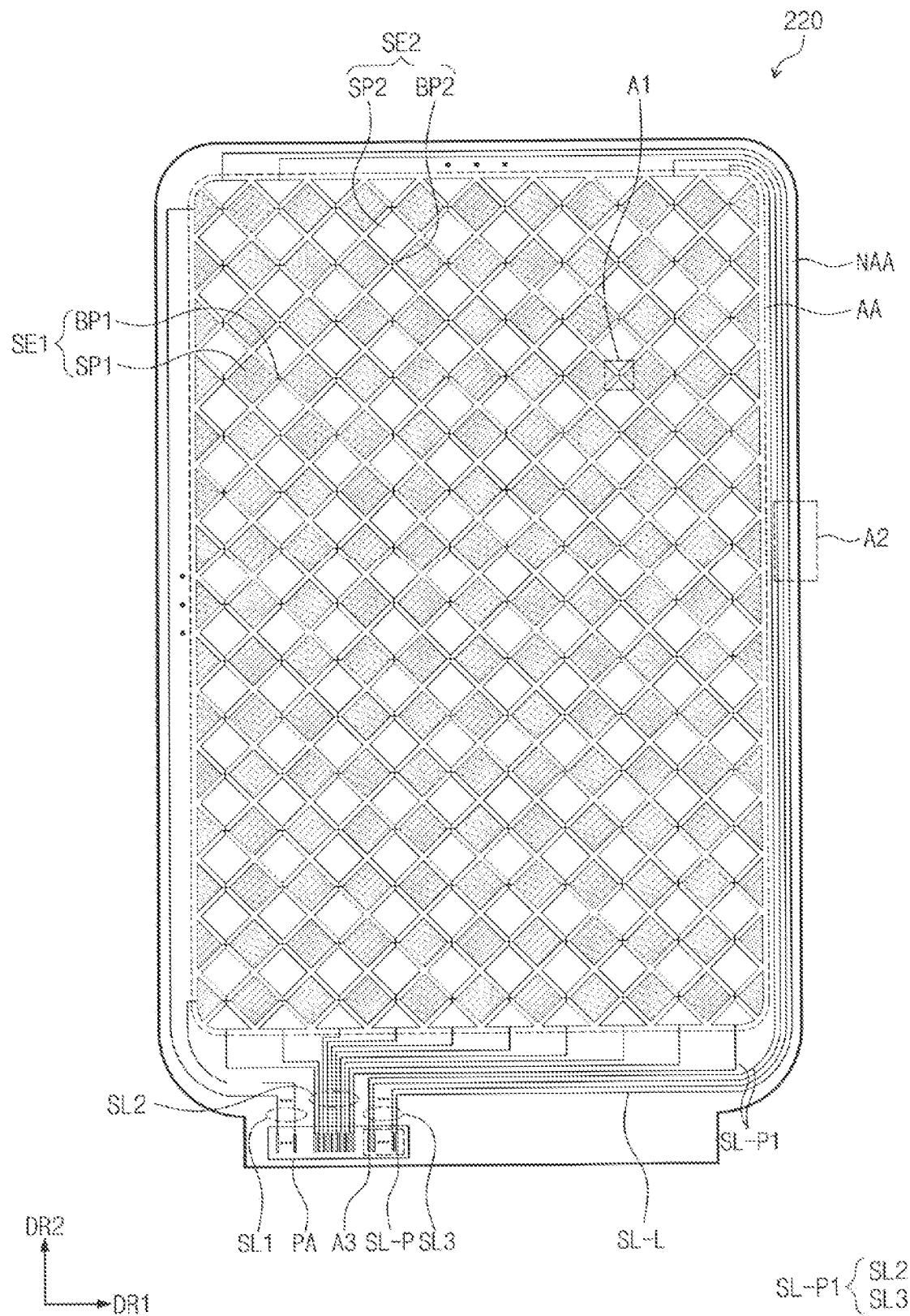
FIG. 3 is a plan view showing an input sensor according to an embodiment of the present disclosure.

FIG. 3 is a plan view showing the input sensor 220 according to an embodiment of the present disclosure. The input sensor 220 may include a plurality of sensing electrodes SE1 and SE2 and a plurality of signal lines SL1, SL2, and SL3 connected to the sensing electrodes SE1 and SE2.

The sensing electrodes SE1 and SE2 may be disposed in the active area AA. The sensing electrodes SE1 and SE2 may include a plurality of first sensing electrodes SE1 and a plurality of second sensing electrodes SE2 crossing the first sensing electrodes SE1. The first sensing electrodes SE1 may each extend in the first direction DR1 and may be arranged in the second direction DR2. Each of the first sensing electrodes SE1 may include a plurality of first sensing portions SP1 and a plurality of first intermediate portions BP1, which are arranged in the first direction DR1.

The second sensing electrodes SE2 may each extend in the second direction DR2 and may be arranged in the first direction DR1. Each of the second sensing electrodes SE2 may include a plurality of second sensing portions SP2 and a plurality of second intermediate portions BP2, which are arranged in the second direction DR2.

The signal lines SL1, SL2, and SL3 may be disposed in the peripheral area NAA. The signal lines SL1, SL2, and SL3 may include a plurality of first signal lines SL1, a plurality of second signal lines SL2, and a plurality of third signal lines SL3.

The plurality of first signal lines SL1 may each be respectively connected to one end of opposing ends of the first sensing electrodes SE1. The plurality of second signal lines SL2 may each be respectively connected to one end of opposing ends of the second sensing electrodes SE2, while the plurality of third signal lines SL3 may each be respectively connected to another opposing end of the second sensing electrodes SE2. Hereinafter, one second signal line SL2 and one third signal line SL3 which are connected to the opposite ends of one second sensing electrode SE2 are referred to as a first line pair SL-P1. The number of the first line pairs SL-P1 corresponds to the number of the second sensing electrodes SE2 in the input sensor 220.

Each of the first, second, and third signal lines SL1, SL2, and SL3 may include a line portion SL-L and a pad portion SL-P. The pad portions SL-P of the first, second, and third signal lines SL1, SL2, and SL3 may be arranged in the first direction DR1. In the peripheral area NAA, an area in which the pad portions SL-P of the first, second, and third signal lines SL1, SL2, and SL3 are arranged may be referred to as a pad area PA.

Figure 4A:
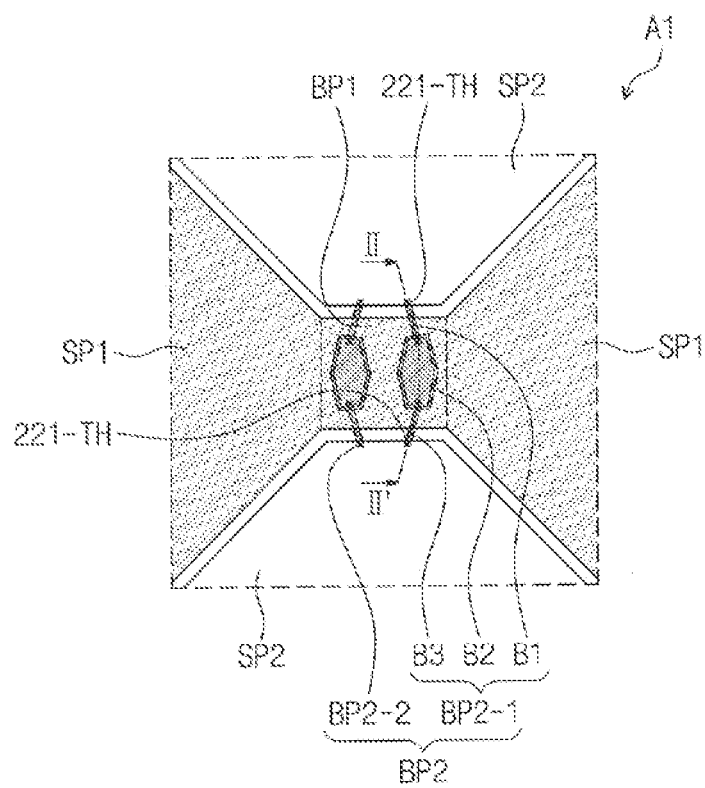
FIG. 4A is a plan view showing a first area of FIG. 3.
Figure 4B:
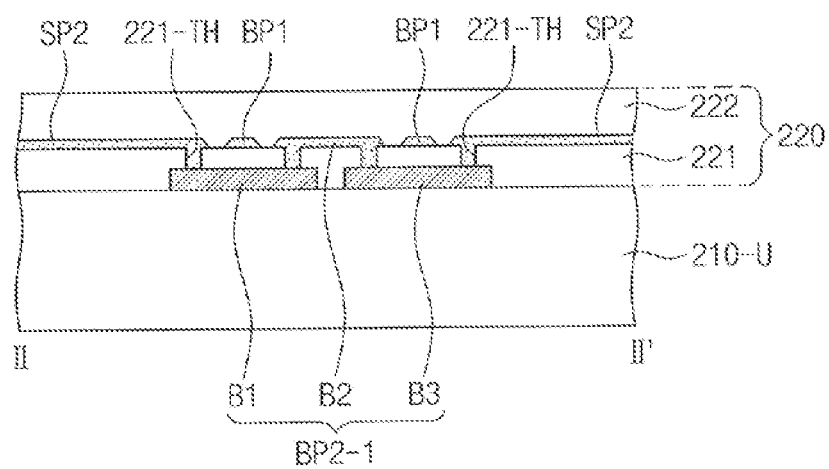
FIG. 4B is a cross-sectional view taken along a line II-II' of FIG. 4A.

FIG. 4A is a plan view showing a first area A1 of FIG. 3. FIG. 4B is a cross-sectional view taken along a line II-II' of FIG. 4A. Hereinafter, the input sensor 220 will be described in detail with reference to FIGS. 3, 4A, and 4B.

Referring to FIGS. 4A and 4B, the first area A1 may correspond to a crossing area of the first sensing electrode SE1 and the second sensing electrode SE2. The first intermediate portion BP1 and the second intermediate portion BP2 may be disposed in the crossing area. As in the present embodiment, the first sensing portion SP1 may be provided integrally with the first intermediate portion BP1; however, the present disclosure should not be limited thereto or thereby. According to an embodiment of the present disclosure, the second sensing portion SP2 may be provided integrally with the second intermediate portion BP2.

In the second sensing electrode SE2, the second sensing portion SP2 and the second intermediate portion BP2, separated from each other, may be respectively defined as an electrode pattern and a bridge pattern. That is, in the present embodiment, the second sensing electrode SE2 may include electrode patterns SP2 and bridge patterns BP2. In the present embodiment, a first bridge pattern BP2-1 and a second bridge pattern BP2-2, which are disposed in one crossing area, are shown as a representative example; however, the quantity of bridge patterns BP2 should not be particularly limited.

In the present embodiment, each of the first bridge pattern BP2-1 and the second bridge pattern BP2-2 may include a first portion B1, a second portion B2, and a third portion B3. The second portion B2 may be disposed on a layer different from a layer on which the first portion B1 and the third portion B3 are disposed. The second portion B2 may be disposed on the same layer as the electrode patterns SP2. In the present embodiment, the first bridge pattern BP2-1 and the second bridge pattern BP2-2, each including a plurality of portions B1, B2, and B3, are shown as a representative example; however, they should not be particularly limited. According to an embodiment of the present disclosure, each of the first bridge pattern BP2-1 and the second bridge pattern BP2-2 may be implemented as a single pattern disposed on the same layer as the first portion B1, and the single pattern may connect two second sensing portions SP2 spaced apart from each other. The single pattern does not overlap the first intermediate portion BP1 and may overlap the first sensing portion SP1.

As shown in FIGS. 4A and 4B, the input sensor 220 may be disposed on the encapsulation substrate 210-U. In the present embodiment, the encapsulation substrate 210-U is shown including only a base substrate (or a second base substrate) as a representative example; however, the present disclosure should not be limited thereto or thereby. In the present embodiment, a structure in which a portion of the bridge pattern BP2 contacts an upper surface of the encapsulation substrate 210-U is shown; however, the present disclosure should not be limited thereto or thereby. According to an embodiment of the present disclosure, a buffer layer may be further disposed on the upper surface of the encapsulation substrate 210-U, and the portion of the bridge pattern BP2 may contact an upper surface of the buffer layer. The buffer layer may include an inorganic layer and/or an organic layer. According to an embodiment of the present disclosure, the input sensor 220 is not disposed directly on the encapsulation substrate 210-U. In this case, the input sensor 220 may further include a base layer, and the base layer of the input sensor 220 may be coupled to the encapsulation substrate 210-U by the adhesive layer.

At least a portion of the bridge pattern BP2 may be disposed on the upper surface of the encapsulation substrate 210-U. The first portion B1 and the third portion B3 may be disposed on the upper surface of the encapsulation substrate 210-U. The first portion B1 and the third portion B3 may include a metal material. The first portion B1 and the third portion B3 may include titanium (Ti), aluminum (Al), copper (Cu), gold (Au), silver (Ag), or the like as the metal material. The first portion B1 and the third portion B3 may be a multi-layered structure including a metal layer containing the metal material. Each of the first portion B1 and the third portion B3 may have a three-layer structure of titanium/aluminum/titanium.

A first insulating layer 221 may be disposed on the upper surface of the encapsulation substrate 210-U. The first sensing electrode SE1, the electrode patterns SP2, and the second portion B2 may be disposed on the first insulating layer 221. The first intermediate portion BP1 may be provided with an opening in which the second portion B2 is disposed. The electrode patterns SP2 and the second portion B2 may be connected to the bridge pattern BP2 via a through hole 221-TH defined through the first insulating layer 221.

The first sensing electrode SE1, the electrode patterns SP2, and the second portion B2 may include the same material as each other. The first sensing electrode SE1, the electrode patterns SP2, and the second portion B2 may include a transparent conductive oxide (TCO). The first sensing electrode SE1, the electrode patterns SP2, and the second portion B2 may include indium tin oxide (ITO), indium zinc oxide (IZO), zinc oxide (ZnO), indium tin zinc oxide (ITZO), or the like. In addition, the first sensing electrode SE1, the electrode patterns SP2, and the second portion B2 may include PEDOT, metal nanowire, graphene, or the like.

A second insulating layer 222 may be disposed on the first insulating layer 221. The second insulating layer 222 may cover the first sensing electrode SE1, the electrode patterns SP2, and the second portion B2. The first insulating layer 221 and the second insulating layer 222 may include an inorganic material and an organic material.

Figure 5A:
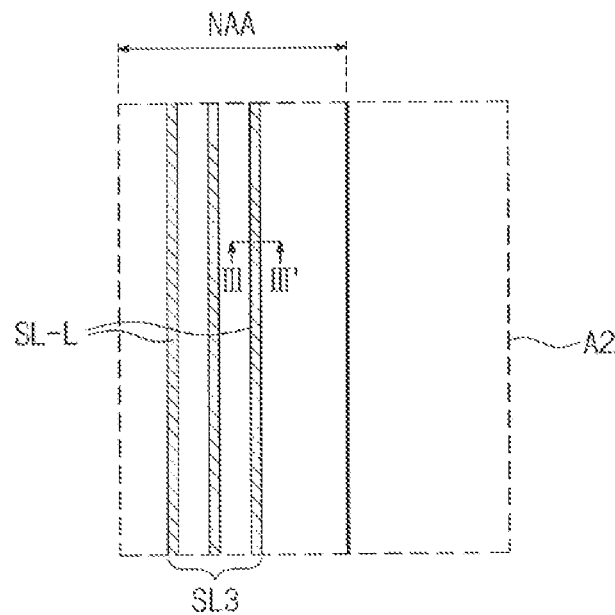
FIG. 5A is a plan view showing a second area of FIG. 3.
Figure 5B:
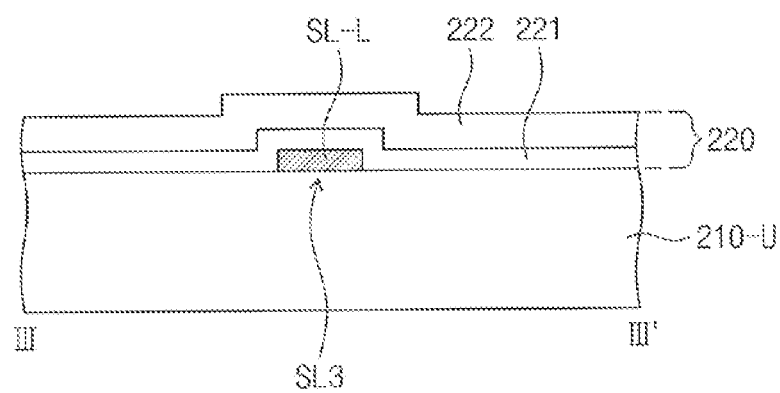
FIG. 5B is a cross-sectional view taken along a line III-III' of FIG. 5A.
Figure 6A:
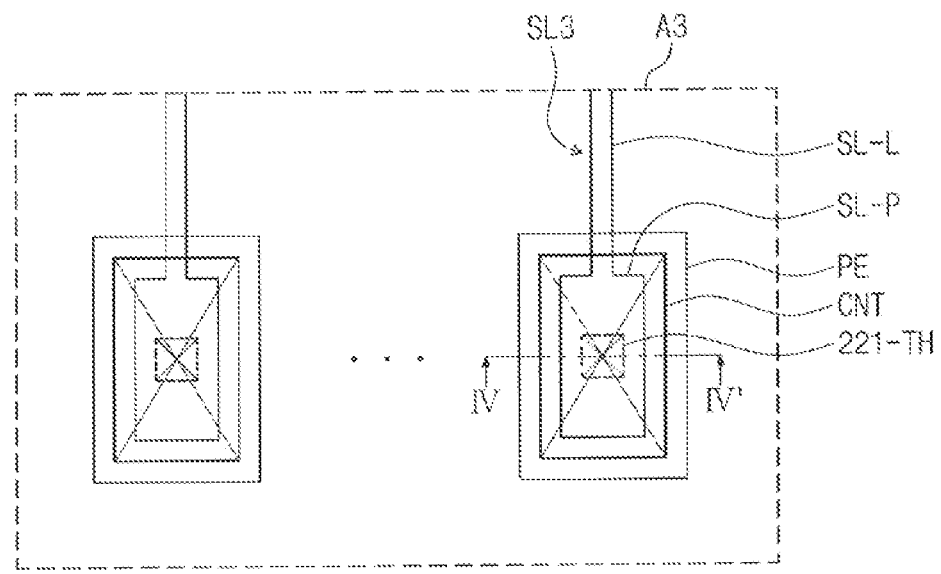
FIG. 6A is a plan view showing a third area of FIG. 3.
Figure 6B:
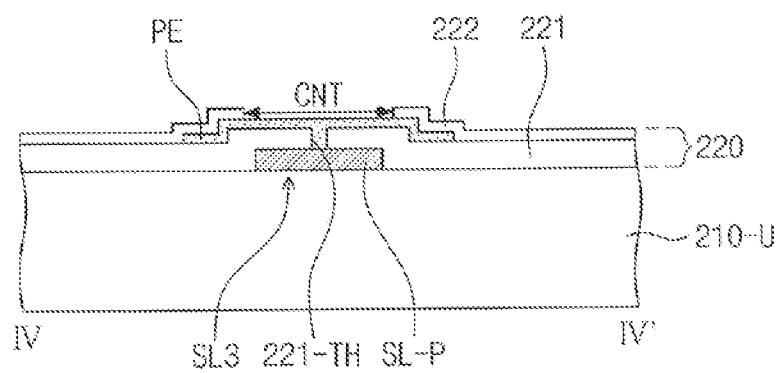
FIG. 6B is a cross-sectional view taken along a line IV-IV' of FIG. 6A.

FIG. 5A is a plan view showing a second area A2 of FIG. 3. FIG. 5B is a cross-sectional view taken along a line III-III' of FIG. 5A. FIG. 6A is a plan view showing a third area A3 of FIG. 3. FIG. 6B is a cross-sectional view taken along a line IV-IV' of FIG. 6A. Hereinafter, the input sensor 220 will be described together with reference to FIGS. 3 to 4B.

Referring to FIGS. 5A to 6B, the third signal line SL3 may include the line portion SL-L and the pad portion SL-P. The first signal line SL1 and the second signal line SL2 may have substantially the same structure as that of the third signal line SL3. The distinction between the line portion SL-L and the pad portion SL-P may be defined by an arrangement relationship with respect to the circuit board FCB (refer to FIG. 1B). A portion of the signal line SL3 overlapping the circuit board FCB may be defined as the pad portion SL-P.

As shown in FIGS. 5A and 5B, the line portion SL-L may be disposed between the first insulating layer 221 and the second insulating layer 222. The line portion SL-L may be formed through the same process as and may include the same material as the first portion B1 and the third portion B3 of the bridge pattern BP2.

Referring to FIGS. 6A and 6B, the pad portion SL-P may be provided integrally with the line portion SL-L. The pad portion SL-P is shown to have a width different from that of the line portion SL-L; however, the present disclosure should not be limited thereto or thereby. In an embodiment different from the structure shown in FIG. 6A, the pad portion SL-P and the line portion SL-L may have substantially the same width as each other.

The input sensor 220 may further include a pad electrode PE. The pad electrode PE may be disposed on the first insulating layer 221 and may be connected to the pad portion SL-P via the through hole 221-TH defined through the first insulating layer 221. The second insulating layer 222 may be provided with a contact hole CNT defined therethrough to expose at least the pad electrode PE. At least the pad electrode PE may be electrically connected to the pad of the circuit board FCB through an anisotropic conductive adhesive layer. Hereinafter, the anisotropic conductive adhesive layer will be described as an example of the conductive bonding structure; however, the present disclosure should not be limited thereto or thereby. For example, the conductive bonding structure may include a solder ball or a solder paste. The pad electrode PE may include the same material as the first sensing electrode SE1. For example, the pad electrode PE may include the same transparent conductive oxide as the first sensing portions SP1 (refer to FIG. 4B).

Figure 7A:
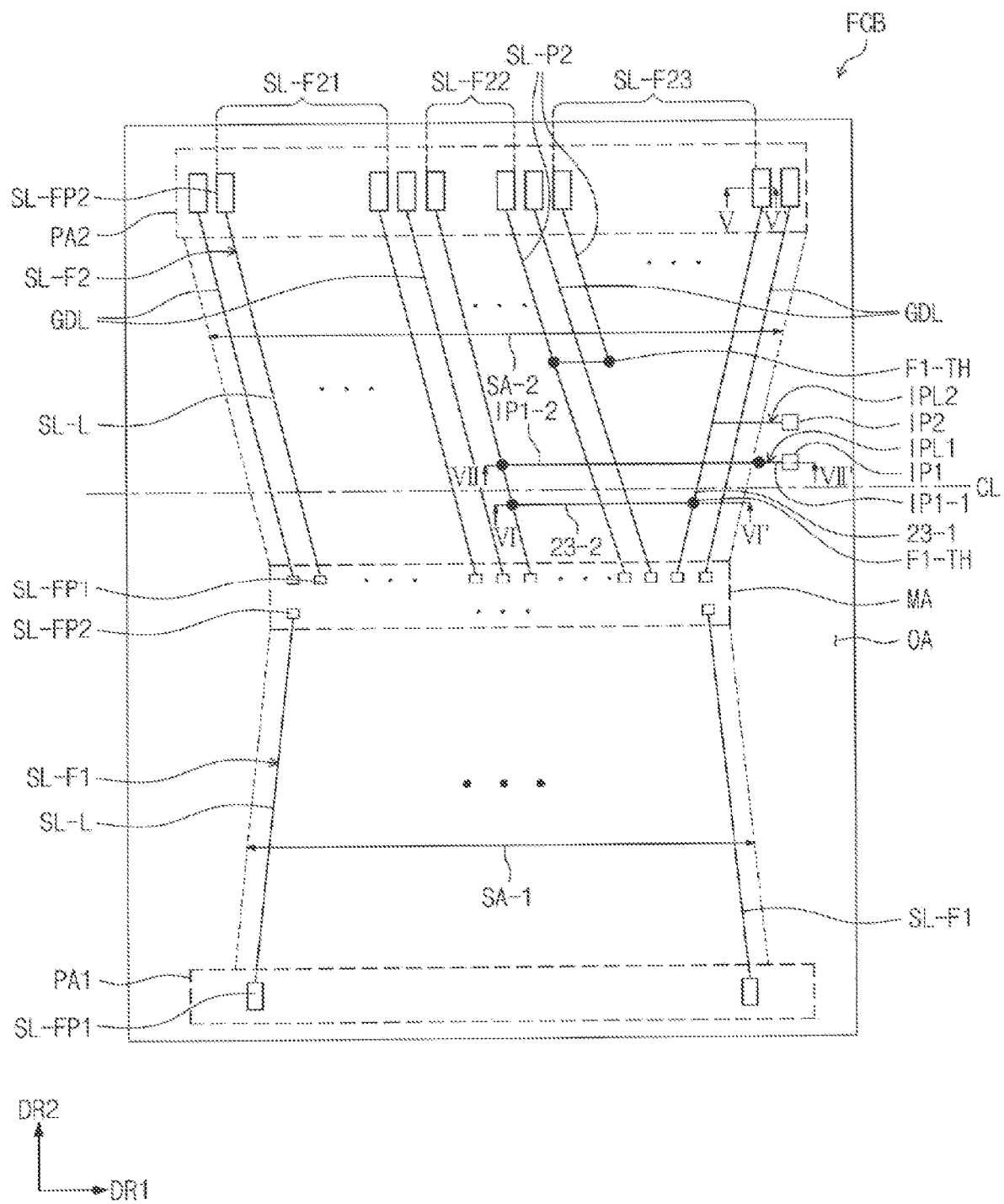
FIG. 7A is a plan view showing a circuit board according to an embodiment of the present disclosure.
Figure 7B:
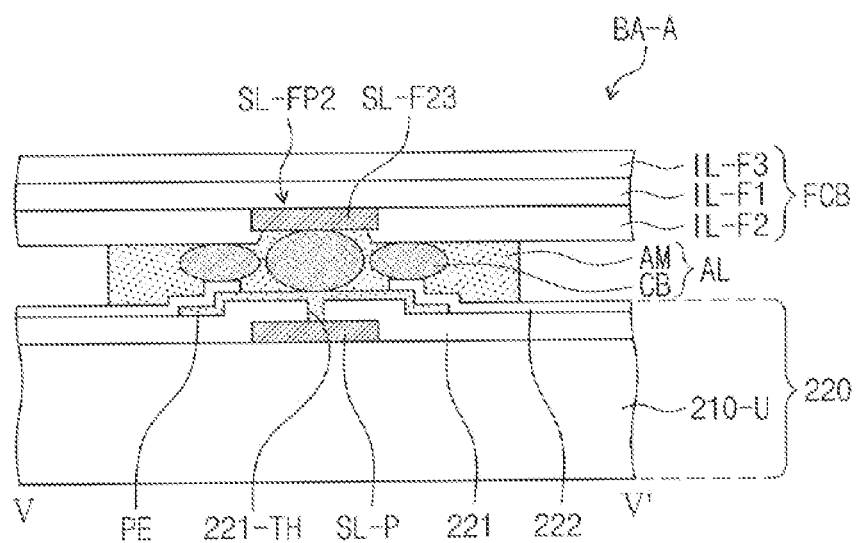
FIG. 7B is a cross-sectional view taken along a line V-V' of FIG. 7A to show an effective bonding area.
Figure 7C:
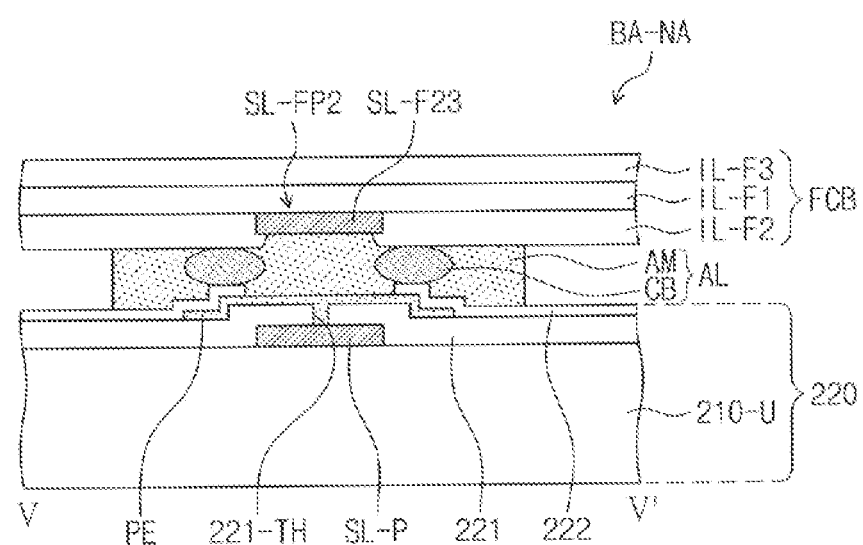
FIG. 7C is a cross-sectional view taken along a line V-V' of FIG. 7A to show a defective bonding area.
Figure 7D:
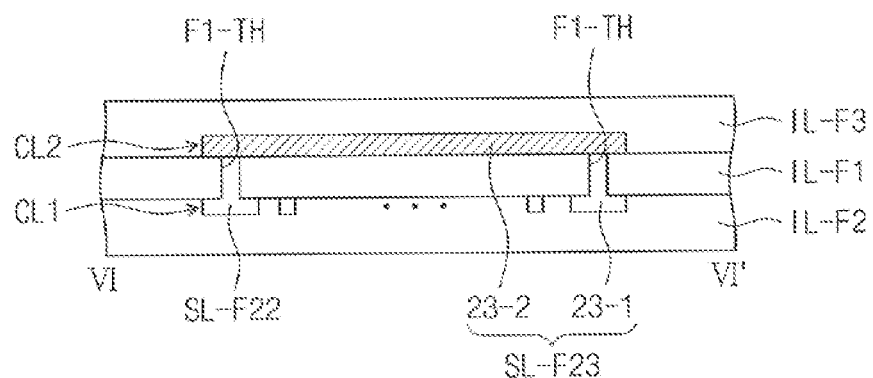
FIG. 7D is a cross-sectional view taken along a line VI-VI' of FIG. 7A.
Figure 7E:
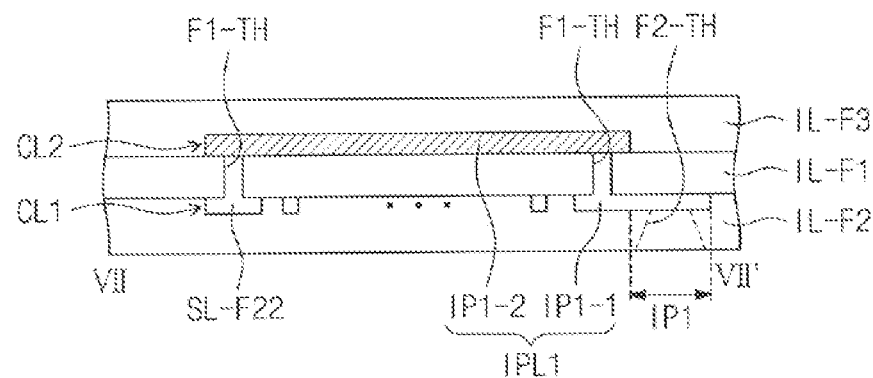
FIG. 7E is a cross-sectional view taken along a line VII-VII' of FIG. 7A.

FIG. 7A is an enlarged plan view showing the circuit board FCB shown in FIG. 1B according to an embodiment of the present disclosure. FIG. 7B is a cross-sectional view taken along a line V-V' of FIG. 7A to show an effective bonding area BA-A. FIG. 7C is a cross-sectional view taken along a line V-V' of FIG. 7A to show a defective bonding area BA-NA. FIG. 7D is a cross-sectional view taken along a line VI-VI' of FIG. 7A. FIG. 7E is a cross-sectional view taken along a line VII-VII' of FIG. 7A. FIGS. 7B and 7C correspond to cross-sections of the bonding area of the circuit module FTC and the input sensor 220 shown in FIG. 1B. FIGS. 7B, 7C, and 7D show a cross-section of the input sensor 220 shown in FIG. 6B.

Referring to FIG. 7A, the circuit board FCB may include a mounting area MA on which the driving circuit chip TIC of the input sensor 220 is mounted, a first line area SA1 in which first substrate signal lines SL-F1 (hereinafter referred to as first lines SL-F1) are disposed, a second line area SA2 in which second substrate signal lines SL-F2 (hereinafter referred to as second lines SL-F2) are disposed, and an outer area OA outside the mounting area MA, the first line area SA1, and the second line area SA2.

The first lines SL-F1 may transmit a signal applied thereto from an external electronic component to the driving circuit chip TIC or may transmit a signal applied thereto from the driving circuit chip TIC to the external electronic component. As described above, the external electronic component may be the display panel (refer to FIG. 1B) or a main circuit substrate (not shown). The second lines SL-F2 may transmit a driving signal applied thereto from the driving circuit chip TIC to the input sensor 220 or may transmit a sensing signal applied thereto from the input sensor 220 to the driving circuit chip TIC. The driving circuit chip TIC may convert the sensing signal, which is input thereto as an analog signal, to a digital signal and may apply the digital signal to the first lines SL-F1.

The first lines SL-F1 may be provided in one group and may have the same line structure as each other. The second lines SL-F2 may be provided in a plurality of groups having different line structures from each other. The second lines SL-F2 may include a first group signal line SL-F21 whose one end is electrically connected to the first signal lines SL1 (refer to FIG. 3), a second group signal line SL-F22 whose one end is electrically connected to the second signal lines SL2 (refer to FIG. 3), and a third group signal line SL-F23 whose one end is electrically connected to the third signal lines SL3 (refer to FIG. 3). Each of the first group signal line SL-F21, the second group signal line SL-F22, and the third group signal line SL-F23 may include a plurality of signal lines.

The anisotropic conductive adhesive layer AL (refer to FIG. 7B) may be disposed between a second pad area PA2 described below and the pad area PA (refer to FIG. 3) of the input sensor 220 described above to electrically connect the first group signal line SL-F21, the second group signal line SL-F22, and the third group signal line SL-F23 to the first signal lines SL1 (refer to FIG. 3), the second signal lines SL2 (refer to FIG. 3), and the third signal lines SL3 (refer to FIG. 3), respectively.

The other end of the third group signal line SL-F23 may be electrically connected to the second group signal line SL-F22. It may be understood that the third group signal line SL-F23 is branched from the second group signal line SL-F22. Hereinafter, two signal lines that are connected to each other and include one signal line among the signal lines of the second group signal line SL-F22 and one signal line among the signal lines of the third group signal line SL-F23 may be referred to as a second line pair SL-P2. The quantity of the second line pairs SL-P2 included in the circuit board FCB may correspond to the quantity of the first line pairs SL-P1 (refer to FIG. 3). The second signal line SL2 (refer to FIG. 3) and the third signal line SL3 (refer to FIG. 3) of the first line pair SL-P1 (refer to FIG. 3) may be respectively connected to the second group signal line SL-F22 and the third group signal line SL-F23 of the second line pair SL-P2 to receive the same driving signal.

Shielding lines GDL may be further disposed in the second line area SA2. The shielding lines GDL may be disposed between the group signal lines SL-F21, SL-F22, and SL-F23 that are distinct from each other. One shielding line of the shielding lines GDL may be disposed between the first group signal line SL-F21 and the second group signal line SL-F22, and another shielding line of the shielding lines GDL may be disposed between the second group signal line SL-F22 and the third group signal line SL-F23. The shielding lines GDL may prevent a coupling between the group signal lines SL-F21, SL-F22, and SL-F23 that are distinct from each other. The shielding lines GDL may receive a ground voltage to prevent a signal interference between the group signal lines SL-F21, SL-F22, and SL-F23 that are distinct from each other. One shielding line of the shielding lines GDL may receive a signal that is synchronized with a signal applied to one signal line of two signal lines disposed at both sides thereof among the group signal lines SL-F21, SL-F22, and SL-F23 that are distinct from each other.

A shielding line of the shielding lines GDL may be further disposed at a left side of the first group signal line SL-F21 and a shielding line of the shielding lines GDL may be further disposed at a right side of the third group signal line SL-F23. These shielding lines GDL that are further disposed may prevent a coupling between an additional signal line (not shown) disposed outside the shielding lines GDL and the first group signal line SL-F21 or the third group signal line SL-F23.

Each of the first lines SL-F1 and the second lines SL-F2 may include a first pad portion SL-FP1, a second pad portion SL-FP2, and a line portion SL-L connecting the first pad portion SL-FP1 and the second pad portion SL-FP2. The first pad portion SL-FP1 and the second pad portion SL-FP2 may correspond to opposite ends of the first lines SL-F1 and the second lines SL-F2.

An area in which the first pad portions SL-FP1 of the first lines SL-F1 are aligned may be referred to as a first pad area PA1, and an area in which the second pad portions SL-FP2 of the second lines SL-F2 are aligned may be referred to as a second pad area PA2. The first pad area PA1 may be a portion of the first line area SA1, and the second pad area PA2 may be a portion of the second line area SA2. The second pad portions SL-FP2 of the first lines SL-F1 and the first pad portions SL-FP1 of the second lines SL-F2 may be disposed in the mounting area MA.

The first pad portions SL-FP1 and the second pad portions SL-FP2 may be exposed to the outside of the circuit board FCB to be electrically bonded to the driving circuit chip TIC (refer to FIG. 1B), the input sensor 220 (refer to FIG. 1B), or the main circuit substrate (not shown). The first pad portions SL-FP1 and the second pad portions SL-FP2 of the first lines SL-F1 and the first pad portions SL-FP1 and the second pad portions SL-FP2 of the second lines SL-F2 may be exposed through the upper surface of the circuit board FCB or through a lower surface of the circuit board FCB; however, the present disclosure should not be limited thereto or thereby.

The mounting area MA, the first pad area PA1, and the second pad area PA2 may be designed independently, and it is sufficient that pad portions disposed in the same area are exposed to the same direction. On the assumption that FIG. 7A shows the plan view, viewed from above, of the upper surface of the circuit board FCB, the pad portions SL-FP1 and SL-FP2 disposed in the mounting area MA may be exposed to the upper surface of the circuit board FCB, and the pad portions SL-FP1 and SL-FP2 disposed in the first pad area PA1 and the second pad area PA2 may be exposed to the lower surface of the circuit board FCB.

The shielding lines GDL may also include a first pad portion SL-FP1, a second pad portion SL-FP2, and a line portion SL-L. Although not shown in FIG. 3, the pad portions of the signal line corresponding to the second pad portions SL-FP2 of the shielding lines GDL may be disposed in the pad area PA connected to the circuit board FCB including the shielding line GDL.

FIG. 7B shows an example of an effective bonding area BA-A of the circuit module FTC and the input sensor 220. In an effective bonding area BA-A, a conductive ball CB may electrically connect the pad electrode PE to the second pad portion SL-FP2 of the third group signal line SL-F23 when the conductive ball CB is pressed. The anisotropic conductive adhesive layer AL may include an adhesive layer AM and a plurality of conductive balls CB distributed in the adhesive layer AM. The conductive balls CB may be randomly distributed or may be aligned in a single layer. The configuration of the anisotropic conductive adhesive layer AL should not be particularly limited.

In contrast, FIG. 7C shows an example of a defective bonding area BA-NA. In a defective bonding area BA-NA, a conductive ball CB does not electrically and effectively connect the pad electrode PE and the second pad portion SL-FP2 when the conductive ball CB is pressed. FIG. 7C shows a structure in which a conductive ball CB is not disposed between the pad electrode PE and the second pad portion SL-FP2; however, the cause of defects in bonding should not be limited thereto or thereby. For example, a structure in which a conductive ball CB is not sufficiently in contact with at least one of the pad electrode PE and the second pad portion SL-FP2 may cause defects in bonding.

Referring to FIGS. 7A to 7E, the circuit board FCB may include at least one insulating layer IL-F1 (hereinafter referred to as a first insulating layer), at least a first conductive layer CL1, and at least a second conductive layer CL2. The first conductive layer CL1 and the second conductive layer CL2 may be respectively disposed on one surface and the other surface of the first insulating layer IL-F1. Each of the first conductive layer CL1 and the second conductive layer CL2 may include a plurality of conductive patterns. The above-mentioned first lines SL-F1 and second lines SL-F2 may be defined by a combination of the conductive patterns of the first conductive layer CL1 and the conductive patterns of the second conductive layer CL2.

The circuit board FCB may further include a second insulating layer IL-F2 covering the first conductive layer CL1 and a third insulating layer IL-F3 covering the second conductive layer CL2. The second insulating layer IL-F2 and the third insulating layer IL-F3 may be protective layers to protect the first conductive layer CL1 and the second conductive layer CL2, respectively. Each of the first insulating layer IL-F1, the second insulating layer IL-F2, and the third insulating layer IL-F3 may include a plastic resin, such as polyimide, polyamide, or the like. The second insulating layer IL-F2 and the third insulating layer IL-F3 may include a different material from that of the first insulating layer IL-F1. The second insulating layer IL-F2 and the third insulating layer IL-F3 may include a solder resist layer.

In an embodiment of the present disclosure, the second insulating layer IL-F2 and the third insulating layer IL-F3 may be respectively formed at opposite sides of the first insulating layer IL-F1; however, they should not be limited thereto or thereby. A connection structure of the conductive patterns may be partially different depending on the manufacturing sequence; however, the present disclosure should not be limited thereto or thereby. The first conductive layer CL1, the first insulating layer IL-F1, the second conductive layer CL2, and the third insulating layer IL-F3 may be sequentially formed on the second insulating layer IL-F2.

Referring to FIGS. 7A and 7D, the third group signal line SL-F23 may include a first portion 23-1 disposed on the same layer or surface as the second group signal line SL-F22 and a second portion 23-2 disposed on a different layer or surface from the second group signal line SL-F22. FIG. 7D shows a structure in which the second group signal line SL-F22 is disposed on a lower surface of the first insulating layer IL-F1. The second portion 23-2 may be disposed to prevent a short circuit between other signal lines of the second group signal line SL-F22 except for one signal line of the second group signal line SL-F22 that is connected to one signal line of the third group signal line SL-F23. The second portion 23-2 may correspond to a bridge pattern.

As shown in FIG. 7D, one signal line of the second group signal line SL-F22 and the first portion 23-1 of one signal line of the third group signal line SL-F23 may be respectively connected to the second portion 23-2 via through holes F1-TH defined through the first insulating layer IL-F1. Each of the signal lines of the third group signal line SL-F23 may include a plurality of portions; however, the present disclosure should not be limited thereto or thereby. Some of the signal lines of the third group signal line SL-F23 may be provided integrally with each other. In an embodiment different from the structure shown in FIG. 7D, the second group signal line SL-F22 may be provided integrally with the third group signal line SL-F23 nearest to the second group signal line SL-F22.

Referring to FIGS. 7A and 7E, the circuit board FCB may include a first inspection signal line IPL1 whose one end is electrically connected to the second group signal line SL-F22 and a second inspection signal line IPL2 whose one end is electrically connected to the third group signal line SL-F23. The third group signal line SL-F23 to which the second inspection signal line IPL2 is electrically connected may be electrically connected to the second group signal line SL-F22 to which the first inspection signal line IPL1 is connected. Referring to FIG. 7A, the first inspection signal line IPL1 electrically connected to the signal line disposed at the farthest left of the second group signal line SL-F22 and the second inspection signal line IPL2 electrically connected to the signal line disposed at the farthest right of the third group signal line SL-F23 are shown as representative examples. However, the present disclosure should not be limited particularly thereto or thereby, as long as the first inspection signal line IPL1 and the second inspection signal line IPL2 are connected to any one second line pair SL-P2. Both the first inspection signal line IPL1 and the second inspection signal line IPL2 may be provided in plural to be respectively connected to all the second line pairs SL-P2. The first inspection signal line IPL1 and second inspection signal line IPL2 may correspond to an inspection signal line pair corresponding to the second line pair SL-P2.

At least one of the first inspection signal line IPL1 and the second inspection signal line IPL2 may include a first portion IP1-1 disposed on the same layer as the second group signal line SL-F22 and a second portion IP1-2 disposed on a different layer from the second group signal line SL-F22. The second portion IP1-2 may correspond to a bridge pattern. The first portion IP1-1 may be connected to the second portion IP1-2 via the through holes F1-TH defined through the first insulating layer IL-F1. Meanwhile, FIG. 7A shows a structure in which the second inspection signal line IPL2 includes only portions disposed on the same layer as the second group signal line SL-F22.

The first inspection signal line IPL1 and the second inspection signal line IPL2 may respectively include a first inspection terminal IP1 and a second inspection terminal IP2, which are disposed in the outer area OA when viewed in a plan view. The first inspection terminal IP1 and the second inspection terminal IP2 may be portions of the first portion IP1-1 disposed on the same layer as the second group signal line SL-F22. In FIG. 7A, the first inspection terminal IP1 and the second inspection terminal IP2 are shown to have a relatively large line width; however, the present disclosure should not be limited thereto or thereby. As described later, a structural condition of the first inspection terminal IP1 and the second inspection terminal IP2 is satisfied as long as the first inspection terminal IP1 and the second inspection terminal IP2 are the portions exposed through the second insulating layer IL-F2. The dotted lines of FIG. 7E indicate a portion of the second insulating layer IL-F2 that is to be removed by an inspection process to be described later. As the indicated portion of the second insulating layer IL-F2 is removed, an opening F2-TH is defined through which the first inspection terminal IP1 is exposed without being covered by the second insulating layer IL-F2.

In the present embodiment, the first inspection signal line IPL1 including two portions to be exposed through the second insulating layer IL-F2 is shown; however, the present disclosure should not be limited thereto or thereby. According to an embodiment, the first inspection signal line IPL1 may include only the second portion IP1-2 disposed on a different layer from the second group signal line SL-F22. In this case, an opening may be formed through the third insulating layer IL-F3 to expose the first inspection terminal IP1, or an opening may be formed through the first insulating layer IL-F1 and the second insulating layer IL-F2 to expose the first inspection terminal IP1.

Figure 8:
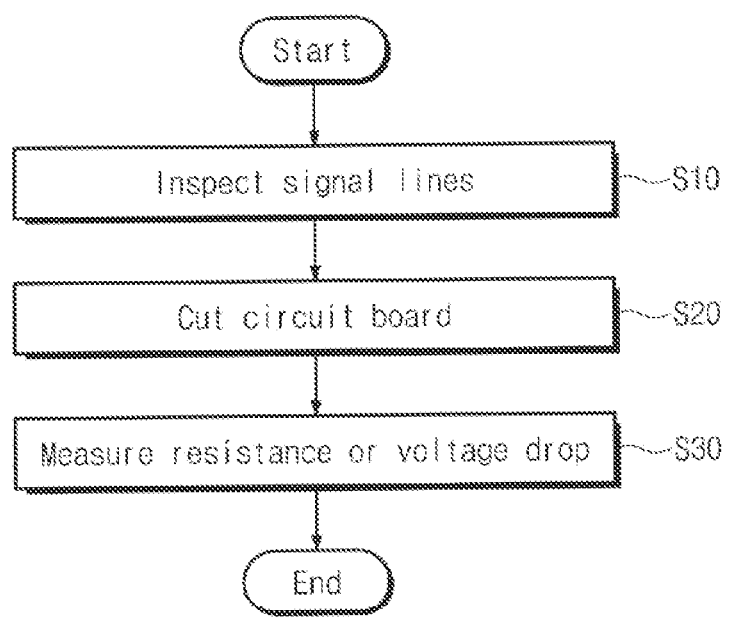
FIG. 8 is a flowchart showing a method of inspecting an electronic device according to an embodiment of the present disclosure.
Figure 9:
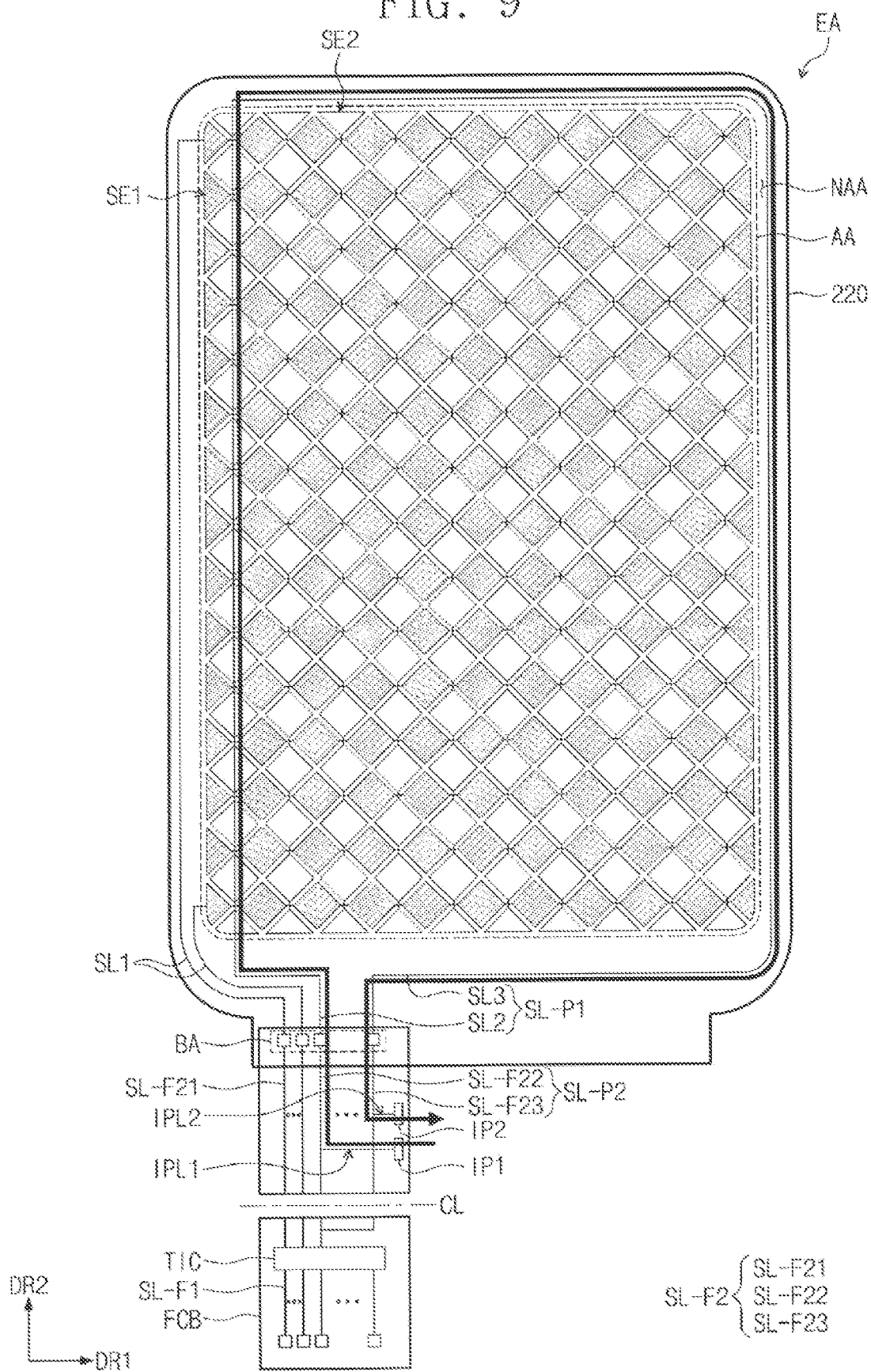
FIG. 9 is a plan view showing the method of inspecting the electronic device according to an embodiment of the present disclosure.

FIG. 8 is a flowchart showing a method of inspecting the electronic device according to an embodiment of the present disclosure. FIG. 9 is a plan view showing the method of inspecting the electronic device according to an embodiment of the present disclosure. Hereinafter, detailed descriptions of the same elements as those described in FIGS. 1 to 7E will be omitted.

An inspection method according to the present embodiment may be performed to determine whether defects in bonding occur, such as when an external input TC is applied but the input TC is not sensed from the input sensor 220. One determination method may be performed by measuring a bonding resistance of an effective bonding area BA-A.

FIG. 9 shows the first signal lines SL1 and one first line pair SL-P1 connected to the second sensing electrode SE2 disposed at the farthest left side, which are shown in FIG. 3. The inspection method described hereinafter may be applied to other first line pairs (not shown).

According to the embodiment of the present disclosure, the inspection method of the electronic device may include inspecting both the signal lines and the bonding of the electronic components for defects. The order of inspecting the signal line and inspecting the bonding of the electronic components should not be particularly limited. When it is determined that none of the signal lines are defective, the bonding of the electronic components is performed, and it is therefore sufficient in such a case for the inspection method of the electronic device to include only inspecting the bonding of the electronic components. However, since defects may occur in a signal line during handling of the electronic device EA after the electronic components are bonded, inspecting the signal lines for defects may be performed as an auxiliary process in any order. Hereinafter, the inspection method of the electronic device will be described in detail.

Referring to FIGS. 8 and 9, the signal lines are inspected (S10). The inspection is performed to determine, for example, whether the first signal lines SL1 and the first line pair SL-P1 are disconnected or cracked. The disconnection or crack may be detected using a microscope.

As shown in FIGS. 8 and 9, the circuit board FCB is cut (S20). The circuit board FCB may be cut to allow the second group signal line SL-F22 and the third group signal line SL-F23 of the second line pair SL-P2 to be electrically opened. FIG. 9 shows a cutting line CL according to the embodiment. As shown in FIG. 9, the circuit board FCB may be cut such that each of the second group signal line SL-F22 and the third group signal line SL-F23 of the second line pair SL-P2 are cut. In FIG. 7A, a position of the cutting line CL with respect to the circuit board FCB is shown. The cutting line CL may be defined in a diagonal direction different from that of FIGS. 7A and 9 as long as the cutting line CL cuts each of the second group signal line SL-F22 and the third group signal line SL-F23 of the second line pair SL-P2.

Meanwhile, according to an alternative embodiment of the present disclosure, only the signal lines are cut, rather than the circuit board FCB, such that the second group signal line SL-F22 and the third group signal line SL-F23 are electrically opened without cutting the circuit board FCB.

Then, as shown in FIGS. 8 and 9, the bonding resistance is measured (S30). The bonding between the input sensor 220 and the circuit board FCB may be inspected for defects using the first inspection signal line IPL1, connected at one end to the second group signal line SL-F22 of the second line pair SL-P2, and the second inspection signal line IPL2, connected at one end to the third group signal line SL-F23 of the second line pair SL-P2.

A resistance between the other end of the first inspection signal line IPL1 and the other end of the second inspection signal line IPL2 may then be measured. A voltage drop between the first inspection terminal IP1 and the second inspection terminal IP2 may be measured. As indicated by a thick arrow shown in FIG. 9, a current path is formed from the first inspection terminal IP1 to the second inspection terminal IP2. The voltage drop when the bonding is defective, as shown for example in FIG. 7C, is much greater than the voltage drop when there is no defect in the bonding, as shown for example in FIG. 7B. This is because the bonding resistance in a defective bonding area is greater than the bonding resistance of a bonding area that is not defective.

In addition, the current path formed from the first inspection terminal IP1 to the second inspection terminal IP2 may serve as a loop resistance. The resistance measured between the first inspection terminal IP1 and the second inspection terminal IP2 may have a value that varies depending on the bonding resistance. In the case of effective bonding, a loop resistance from about 1 kΩ to about 10 kΩ may be measured, and in the case of defective bonding, a loop resistance from about 1 MΩ to about 10 MΩ may be measured. The electronic device EA may be manufactured by changing the anisotropic conductive adhesive layer AL so that a target bonding resistance is set based on the inspected result.

Meanwhile, as shown in FIG. 7E, in the case where the first inspection terminal IP1 is covered by the second insulating layer IL-F2 or the protective layer, the second insulating layer IL-F2 may be removed such that the first inspection terminal IP1 is externally exposed for the measurement of the resistance. To this end, the opening F2-TH may be formed in the area shown in FIG. 7E. This same process may be performed on the third insulating layer IL-F3. However, this process may be omitted in the case where the opening F2-TH is already formed during the process of manufacturing the circuit board FCB.

Figure 10:
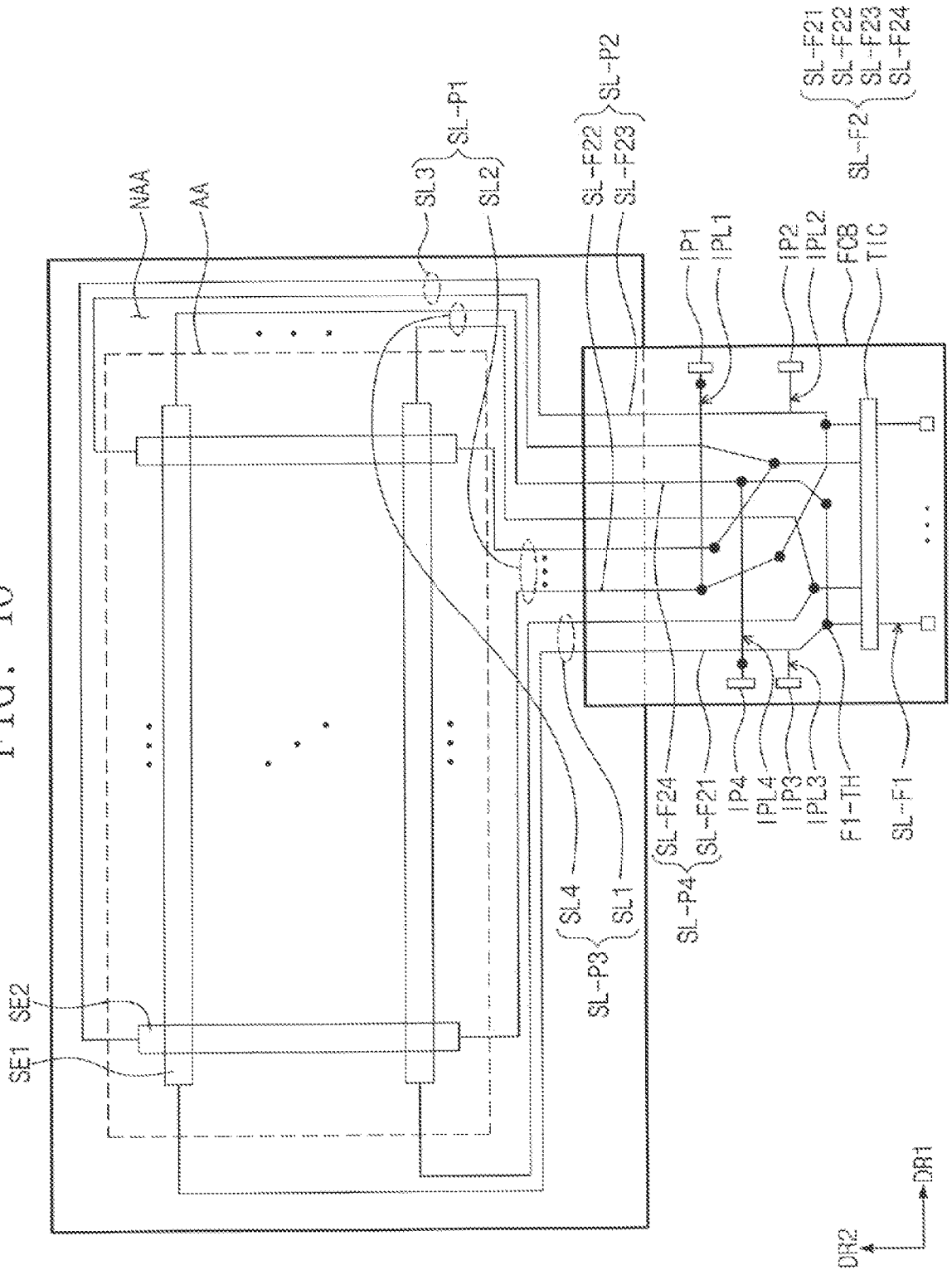
FIG. 10 is a plan view showing an electronic device according to an embodiment of the present disclosure.

FIG. 10 is a plan view showing an electronic device EA according to an embodiment of the present disclosure. Hereinafter, detailed descriptions of the same elements as those described with reference to FIGS. 1 to 9 will be omitted.

Referring to FIG. 10, the first sensing electrode SE1 and the second sensing electrode SE2 may have a stripe shape in which a width of electrodes is constant, and the first sensing electrode SE1 may have a length greater than that of the second sensing electrode SE2; however, the shape of the first sensing electrode SE1 and the second sensing electrode SE2 should not be particularly limited, and the first sensing electrode SE1 and the second sensing electrode SE2 shown in FIG. 3 may be applied to the electronic device EA. For example, the first sensing electrode SE1 and the second sensing electrode SE2 may have a mesh shape. A bridge structure may be applied to the crossing area of the first sensing electrode SE1 and the second sensing electrode SE2.

The input sensor 220 may further include fourth signal lines SL4, and the fourth signal lines SL4 may include a plurality of fourth signal lines SL4. The plurality of fourth signal lines SL4 are each respectively connected to one end of opposing ends of the first sensing electrodes SE1. A first signal line SL1 and a fourth signal line SL4 that are connected to opposing ends of one first sensing electrode SE1 are referred to as a third line pair SL-P3.

The circuit board FCB may further include a fourth group signal line SL-F24 whose one end is electrically connected to the fourth signal lines SL4. The other end of the fourth group signal line SL-F24 may be electrically connected to the first group signal line SL-F21. The fourth group signal line SL-F24 may be branched from the first group signal line SL-F21. A signal line from among the signal lines of the first group signal line SL-F21 and a signal line from among the signal lines of the fourth group signal line SL-F24 may be connected to each other and may be referred to as a fourth line pair SL-P4. The quantity of fourth line pairs SL-P4 included in the circuit board FCB may correspond to the quantity of third line pairs SL-P3.

The circuit board FCB may include a third inspection signal line IPL3 whose one end is electrically connected to the first group signal line SL-F21 and a fourth inspection signal line IPL4 whose one end is electrically connected to the fourth group signal line SL-F24. The third inspection signal line IPL3 and the fourth inspection signal line IPL4 may respectively include a third inspection terminal IP3 and a fourth inspection terminal IP4, which are disposed in an outer area OA when viewed in a plan view.

A bridge pattern may be disposed in the crossing area of the signal lines. At least some of the first inspection signal lines IPL1, IPL2, IPL3, and IPL4 and the first group signal lines SL-F21, SL-F22, SL-F23, and SL-F24 may include portions disposed on different layers from each other.

According to an inspection method of the electronic device EA, the circuit board FCB may be cut such that the fourth line pair SL-P4, including the first group signal line SL-F21 and the fourth group signal line SL-F24, is electrically opened in the cutting of the circuit board FCB described with reference to FIGS. 8 and 9. Then, a voltage drop between the third inspection terminal IP3 and the fourth inspection terminal IP4 may be measured. The inspection method described with reference to the first inspection terminal IP1 and the second inspection terminal IP2 may be applied to the third inspection terminal IP3 and the fourth inspection terminal IP4.

In an example different than the one shown in FIG. 10, the first inspection signal line IPL1 and the second inspection signal line IPL2 may be provided in plural to be respectively connected to all the first line pairs SL-P1. The first inspection signal line IPL1 and the second inspection signal line IPL2 connected to the first line pair SL-P1 may correspond to an inspection signal line pair corresponding to the first line pair SL-P1. The third inspection signal line IPL3 and the fourth inspection signal line IPL4 may be provided in plural to be connected to all the second line pairs SL-P2. The third inspection signal line IPL3 and the fourth inspection signal line IPL4 connected to the second line pair SL-P2 may correspond to an inspection signal line pair corresponding to the second line pair SL-P2.

While the inventive concept has been particularly shown and described with reference to embodiments thereof, it will be understood by one of ordinary skill in the art that variations in form and detail may be made therein without departing from the spirit and scope of the present disclosure.

What is claimed is:

1. An electronic device comprising:
an input sensor comprising:
a first sensing electrode,
a second sensing electrode crossing the first sensing electrode,
a first signal line connected to an end of the first sensing electrode,
a second signal line connected to an end of the second sensing electrode, and
a third signal line connected to another end of the second sensing electrode; and
a circuit board electrically connected to the input sensor, the circuit board comprising:
an insulating layer,
a first substrate signal line at least partially disposed on the insulating layer and electrically connected to the first signal line,
a second substrate signal line at least partially disposed on a first surface of the insulating layer and electrically connected to the second signal line,
a third substrate signal line electrically connected to the third signal line and at least partially disposed on the first surface of the insulating layer,
a fourth substrate signal line connecting the second substrate signal line and the third substrate signal line, wherein the fourth substrate signal line is at least partially disposed on a second surface of the insulating layer opposing the first surface of the insulating layer,
a first inspection signal line electrically connected to the second substrate signal line and comprising a first inspection terminal disposed outside an area in which the first substrate signal line, the second substrate signal line, and the third substrate signal line are disposed, and
a second inspection signal line electrically connected to the third substrate signal line and comprising a second inspection terminal disposed outside the area in which the first substrate signal line, the second substrate signal line, and the third substrate signal line are disposed.

2. The electronic device of claim 1, wherein the fourth substrate signal line does not contact the first substrate signal line.

3. The electronic device of claim 1, wherein the third substrate signal line is connected to the fourth substrate signal line via a through hole defined through the insulating layer.

4. The electronic device of claim 1, wherein at least one of the first inspection signal line and the second inspection signal line is disposed on a same layer as the second substrate signal line, the circuit board further comprising a bridge pattern connecting the at least one of the first inspection signal line and the second inspection signal line with the second substrate signal line, wherein the bridge pattern is disposed on a different layer than the second substrate signal line.

5. The electronic device of claim 4, wherein:
the at least one of the first inspection signal line and the second inspection signal line is at least partially disposed on a surface of the insulating layer;
the bridge pattern is at least partially disposed on another surface of the insulating layer; and
the at least one of the first inspection signal line and the second inspection signal line is connected to the bridge pattern via a through hole defined through the insulating layer.

6. The electronic device of claim 1, wherein:
the circuit board further comprises a protective layer disposed on the insulating layer;

the protective layer at least partially covers the first inspection terminal and the second inspection terminal; and the protective layer exposes one end of each of the first substrate signal line, the second substrate signal line, and the third substrate signal line.

7. The electronic device of claim 1, wherein the second inspection signal line is disposed on a same layer as the second substrate signal line.

8. The electronic device of claim 1, further comprising a driving circuit chip mounted on the circuit board, wherein the first substrate signal line and the second substrate signal line are electrically connected to the driving circuit chip.

9. The electronic device of claim 1, wherein the input sensor and the circuit board are electrically connected to each other by an anisotropic conductive adhesive layer.

10. The electronic device of claim 1, wherein:
the input sensor further comprises a fourth signal line connected to the first sensing electrode; and
the circuit board further comprises:
a fifth substrate signal line electrically connected to the first substrate signal line and to the fourth signal line;
a third inspection signal line electrically connected to the first substrate signal line and comprising a third inspection terminal disposed outside an area in which the first substrate signal line, the second substrate signal line, the third substrate signal line, and the fifth substrate signal line are disposed; and
a fourth inspection signal line electrically connected to the fifth substrate signal line and comprising a fourth inspection terminal disposed outside the area in which the first substrate signal line, the second substrate signal line, the third substrate signal line, and the fifth substrate signal line are disposed.

11. A method of inspecting an electronic device, the electronic device comprising an input sensor and a circuit board electrically connected to the input sensor, the input sensor comprising a first sensing electrode, a second sensing electrode crossing the first sensing electrode, a first signal line connected to the first sensing electrode, a second signal line connected to the second sensing electrode, and a third signal line connected to the second sensing electrode, and the circuit board comprising a first group signal line electrically connected to the first signal line, a second group signal line electrically connected to the second signal line, a third group signal line electrically connected to the second group signal line and to the third signal line, a first inspection signal line electrically connected to the second group signal line and comprising a first inspection terminal disposed outside an area in which the first group signal line, the second group signal line, and the third group signal line are disposed, and a second inspection signal line electrically connected to the third group signal line and comprising a second inspection terminal disposed outside the area in which the first group signal line, the second group signal line, and the third group signal line are disposed, the method comprising:
electrically opening the second group signal line and the third group signal line; and
measuring a resistance between the first inspection terminal and the second inspection terminal.

12. The method of claim 11, wherein the electrically opening the second group signal line and the third group signal line includes cutting the circuit board.

13. The method of claim 11, wherein the measuring the resistance between the first inspection terminal and the second inspection terminal comprises measuring a voltage drop between the first inspection terminal and the second inspection terminal.

14. The method of claim 11, further comprising inspecting the second signal line and the third signal line for a disconnection between the second signal line and the third signal line.

15. The method of claim 11, wherein the circuit board further comprises a protective layer that covers the first inspection terminal and the second inspection terminal and exposes one end of each of the first group signal line, the second group signal line, and the third group signal line, and the method further comprises removing the protective layer such that each of the first inspection terminal and the second inspection terminal is externally exposed.

16. An electronic device comprising:
a display panel;
an input sensor disposed on the display panel and comprising:
a sensing electrode,
a first signal line connected to the sensing electrode, and
a second signal line connected to the sensing electrode; and
a circuit board electrically connected to the input sensor, the circuit board comprising:
an insulating layer,
a first substrate signal line electrically at least partially disposed on a first surface of the insulating layer and connected to the first signal line,
a second substrate signal line electrically connected to the first substrate signal line and to the second signal line,
a first inspection signal line at least partially disposed on the first surface of the insulating layer and electrically connected to the first substrate signal line,
a second inspection signal line electrically connected to the second substrate signal line, and
a bridge pattern disposed on a second surface of the insulating layer opposing the first surface of the insulating layer, the bridge pattern connecting the first substrate signal line and the first inspection signal line.

17. The electronic device of claim 16, wherein the display panel comprises:
a display substrate comprising a plurality of pixels;
an encapsulation substrate disposed on the display substrate; and
a sealing member disposed between the display substrate and the encapsulation substrate, wherein the sealing member attaches the display substrate and the encapsulation substrate.

18. The electronic device of claim 17, wherein the input sensor contacts the encapsulation substrate and wherein an adhesive layer is not disposed between the input sensor and the encapsulation substrate.

19. The electronic device of claim 16, wherein the second portion of the first inspection signal line is disposed on a same layer as the second substrate signal line.

* * * * *